(12) United States Patent
Yamazaki et al.

(10) Patent No.: US 8,441,102 B2
(45) Date of Patent: May 14, 2013

(54) SEMICONDUCTOR DEVICE HAVING A CAPACITOR

(75) Inventors: Shunpei Yamazaki, Setagaya (JP); Toru Takayama, Atsugi (JP); Junya Maruyama, Ebina (JP); Yumiko Ohno, Atsugi (JP); Yuugo Goto, Atsugi (JP); Hideaki Kuwabara, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/234,639

(22) Filed: Sep. 16, 2011

(65) Prior Publication Data

US 2012/0007159 A1    Jan. 12, 2012

Related U.S. Application Data

(60) Continuation of application No. 11/798,095, filed on May 10, 2007, now Pat. No. 8,026,152, which is a division of application No. 10/740,606, filed on Dec. 22, 2003, now Pat. No. 7,230,316.

(30) Foreign Application Priority Data

Dec. 27, 2002    (JP) ................... 2002-380726

(51) Int. Cl.
  *H01L 29/00*    (2006.01)
  *H01L 23/48*    (2006.01)
  *H01L 29/40*    (2006.01)
(52) U.S. Cl.
  USPC ........... 257/532; 257/533; 257/535; 257/783; 257/E27.071

(58) Field of Classification Search ............. 257/532, 257/533, 535, 536, 528, 68, 72, 782, 783, 257/71, E27.071
See application file for complete search history.

(56) References Cited

U.S. PATENT DOCUMENTS

| | | | |
|---|---|---|---|
| 5,376,561 A | 12/1994 | Vu et al. | |
| 5,387,815 A | 2/1995 | Nishiguchi | |
| 5,500,552 A | 3/1996 | Ikeda et al. | |
| 5,643,804 A | 7/1997 | Arai et al. | |
| 5,773,880 A | 6/1998 | Ohno | |
| 5,821,138 A | 10/1998 | Yamazaki et al. | |
| 5,877,533 A | 3/1999 | Arai et al. | |
| 5,929,475 A | 7/1999 | Uemoto et al. | |

(Continued)

FOREIGN PATENT DOCUMENTS

| | | |
|---|---|---|
| EP | 0 720 213 | 7/1996 |
| EP | 0 924 769 A | 6/1999 |

(Continued)

*Primary Examiner* — Shouxiang Hu
(74) *Attorney, Agent, or Firm* — Eric J. Robinson; Robinson Intellectual Property Law Office, P.C.

(57) ABSTRACT

It is an object to provide a semiconductor device integrating various elements without using a semiconductor substrate, and a method of manufacturing the same. According to the present invention, a layer to be separated including an inductor, a capacitor, a resistor element, a TFT element, an embedded wiring and the like, is formed over a substrate, separated from the substrate, and transferred onto a circuit board 100. An electrical conduction with a wiring pattern 114 provided in the circuit board 100 is made by a wire 112 or a solder 107, thereby forming a high frequency module or the like.

12 Claims, 13 Drawing Sheets

U.S. PATENT DOCUMENTS

| | | |
|---|---|---|
| 6,115,090 A | 9/2000 | Yamazaki |
| 6,331,722 B1 | 12/2001 | Yamazaki et al. |
| 6,372,608 B1 | 4/2002 | Shimoda et al. |
| 6,376,333 B1 | 4/2002 | Yamazaki et al. |
| 6,410,364 B1 | 6/2002 | Hashimoto |
| 6,410,960 B1 | 6/2002 | Arai et al. |
| 6,521,511 B1 | 2/2003 | Inoue et al. |
| 6,531,770 B2 | 3/2003 | Nakashima |
| 6,645,830 B2 | 11/2003 | Shimoda et al. |
| RE38,466 E | 3/2004 | Inoue et al. |
| 6,814,832 B2 | 11/2004 | Utsunomiya |
| 6,818,530 B2 | 11/2004 | Shimoda et al. |
| 6,878,607 B2 | 4/2005 | Inoue et al. |
| 7,180,093 B2 | 2/2007 | Takayama et al. |
| 2002/0022279 A1* | 2/2002 | Ogata et al. ................... 438/3 |
| 2002/0047157 A1* | 4/2002 | Hidaka et al. ................. 257/347 |
| 2002/0192886 A1 | 12/2002 | Inoue |
| 2003/0032210 A1 | 2/2003 | Takayama et al. |
| 2003/0063210 A1 | 4/2003 | Tsuboi |

FOREIGN PATENT DOCUMENTS

| | | |
|---|---|---|
| JP | 07-045786 A | 2/1995 |
| JP | 07-045787 | 2/1995 |
| JP | 08-186236 | 7/1996 |
| JP | 10-125929 | 5/1998 |
| JP | 10-125930 | 5/1998 |
| JP | 10-125931 | 5/1998 |
| JP | 10-209464 | 8/1998 |
| JP | 11-026733 A | 1/1999 |
| JP | 2002-344146 | 11/2002 |

* cited by examiner (A)

(B)

(C)

(D)

(E)

(A)

(B)

(C)

(D)

(A)

(B)

(C)

(D)

(E)

(F)

(A)

(B)

(C)

(D)

(E)

(A)

(B)

(A)

(B)

TEM observation picture (cross section)

⊢⎯⎯⎯⎯⎯ 10nm pattern diagram

TEM observation picture (cross section)

⊢⎯⎯ 10nm pattern diagram (A)

(B)

(C)

(D)

SEMICONDUCTOR DEVICE HAVING A CAPACITOR

BACKGROUND OF THE INVENTION

1. Field of the Invention

The present invention relates to a TFT, a resistor element, an LC element attenuating a predetermined frequency band, a semiconductor device on which an integrated circuit combining these elements is mounted, and a method of manufacturing the same.

Note that a semiconductor device in this specification means general devices which can function by using semiconductor characteristics, and all of electro-optic devices, semiconductor circuits and electronic devices are the semiconductor devices.

2. Description of the Related Art

A high frequency integrated circuit (also referred to as MMIC) in which an active element such as a transistor and a passive element such as a capacitor, a resistor or an inductor are formed on one semiconductor substrate is known. An active element such as a MESFET, a HEMT, or a HBT, and a lumped parameter element such as a capacitor, an inductor, or a resistor, and a distributed parameter element such as a microstrip line, or a coplanar line are formed together on a semiconductor substrate in an MMIC. Note that a via hole is used for earthing. It is small and lightweight, and has a good high frequency property, as compared with one on which an active element and a passive element are mounted individually. Because a semiconductor process generally has a high cost, however, when a large area is needed for a passive element, the cost is disadvantageous.

Commonly, a high frequency integrated circuit (MMIC) is configured by integrating a transistor using a single crystal silicon wafer or a transistor using a compound semiconductor, and a chip type inductor or capacitor, and further, a filter element such as a SAW element.

Integration and multifunction of mobile communication devices typified by an analog cellular phone and a digital cellular phone, a PHS terminal and the like, are made by the development of MMIC.

In addition, an active element and a passive element are formed individually, and a circuit that they are mounted on the same semi-insulating substrate is referred to as a HMIC or a HIC. Alternatively, it can be merely referred to as a MIC. An alumina and barium titanate substrate is used for a circuit board, a GaAsPHEMT is used for the active element, a plate electrode shaped chip capacitor, an inductor using a bonding wire, a TaN thin film resistor are used for a lumped parameter element, and a microstrip line is used for a distributed parameter element in the HMIC. Note that a through hole is used for earthing.

In addition, Patent Document 1 describes that a thin film lamination having ten layers or less is formed for a thin film integrated circuit in a thin film process in a complex integrated circuit component. Further, Patent Document 2 describes that a high frequency module is formed by compounding a circuit formed with a TFT and a high frequency filter.

Patent Document 1

Japanese Patent Laid-Open No. Hei 7-45787

Patent Document 2

Japanese Patent Laid-Open No. Hei 10-209464

BRIEF SUMMARY OF THE INVENTION

A further reduction in size and weight, thinning, lower cost are required, and the present invention provides a novel structure that can integrate various complex circuits.

Means for Solving the Problem

One feature of the present invention is that a circuit (or an element) mounted conventionally as a chip component (L, C, R) is formed on an insulating substrate without using a semiconductor substrate, and separated from the insulating substrate by a separation technique, and bonded to a circuit board or a film.

Specifically, one feature of the present invention is that a paste for an internal electrode layer and a paste for a dielectric layer are laminated by a sheet method or a printing method over a substrate to form and bake a laminated capacitor, a laminated inductor (a laminated coil), a resistor circuit, and the like. Thereafter, they are separated from the substrate and transferred to a circuit board or a film.

In addition, one feature of the present invention is that a passive circuit element (a LPF, a BPF (representatively, a SAW filter), a diplexer, a coupler, a balun or the like) that combines a capacitor, an inductor and a resonator (a distributed constant) is formed on a substrate, and then, separated from the substrate, and transferred to a circuit board or a film.

In addition, one feature of the present invention is that a capacitor element using a high dielectric thin film as a capacitive insulating film is formed on the same substrate as a CMOS circuit made up of a TFT, and then, separated from the substrate and transferred to a circuit board or a film.

In addition, one feature of the present invention is that an impedance matching circuit comprising a distributed constant line such as a microstrip line or a coplanar line in a high frequency region is formed on a substrate and separated from the substrate, and transferred to a circuit board or a film.

In addition, according to the present invention, an insulating layer is formed on a substrate, an embedded wiring (such as Cu, Au, Ag, Ni, chrome, palladium, rhodium, tin, lead, or an alloy of these elements) is formed, and then, separated from the substrate and transferred to a circuit board or a film to use it as various wirings. In this case, not only the embedded wiring with low resistance but also the insulating film in the circumference is transferred in a sheet-like shape. In addition, after forming an embedded wiring surrounded with a metal protective film (such as Ti, TiN, Ta, or TaN), it may be separated from the substrate and transferred to a circuit board or a film.

In addition, one feature of the present invention is that a plurality of various circuits, elements, and wirings described above are formed on the same substrate, and then separated from the substrate, and transferred to a circuit board or a film. Noise can be reduced by the present invention by which various circuits, elements, wirings can be formed on the same substrate. According to the present invention, an RF circuit, a CPU, a memory (SRAM, DRAM, a flash memory) and the like can be formed on the same substrate, and transferred. Further weight saving, integration or reduction in cost is realized by the present invention.

A structure of the present invention disclosed in this specification is a semiconductor device having a complex integrated circuit where a substrate on which an inductor is formed on an insulating surface thereof and a layer including a thin film transistor connected to the inductor are laminated, as shown by an example in FIG. 2(C).

Another structure of the present invention is a semiconductor device having a complex integrated circuit where a substrate on which a capacitor is formed on an insulating surface thereof and a layer including a thin film transistor connected to the capacitor are laminated, as shown by an example in FIG. 2(D).

Another structure of the present invention is a semiconductor device having a complex integrated circuit where a substrate on which an inductor and a capacitor are formed on an insulating surface thereof and a thin film transistor connected to the inductor or the capacitor are laminated, as shown by an example in FIG. 1 or FIG. 3.

Another structure of the present invention is a semiconductor device having a complex integrated circuit where a substrate on which an inductor, a capacitor, and a resistor element are formed on an insulating surface thereof and a thin film transistor connected to the inductor, the capacitor, or the resistor element are laminated.

In each of the above described structures, one feature is that the inductor is a laminated inductor or is formed from a spiral like transmission line. Further, in each of the above described structures, one feature is that the capacitor is a laminated capacitor or a MIM type capacitor.

Another structure of the present invention is a semiconductor device having a complex integrated circuit where a substrate on which a SAW element is formed on an insulating surface thereof and a thin film transistor connected to the SAW element are laminated, as shown by an example in FIG. 5.

In each of the above described structures, one feature is that the SAW element is made by using a diamond thin film.

In each of the above described structures, one feature is that the substrate is a ceramic substrate, a quartz substrate, a glass substrate, or a plastics substrate. It can be selected appropriately depending on a substrate for mounting, thereby enhancing reliability.

In each of the above described structures, one feature is that a CPU, a memory element, a thin film diode, a photoelectric transducer, or a resistor element is provided on the substrate having the insulating surface.

In each of the above described structures, the semiconductor device is a video camera, a digital camera, a goggle type display, a navigation device typified by a car navigation, a DVD player, an electronic game machine, a card (such as an ID card, a card having a functional circuit or an element, or a card key), a computer, a memory that can memorize data, or a personal digital assistant.

A separation method and a transfer method are as follows: a metal film (such as a tungsten film, nitride tungsten, a tungsten alloy) is formed on a substrate, and then, a silicon oxide film is formed by a sputtering method. A tungsten oxide film in an amorphous state is formed in the vicinity of a boundary at this stage. And after a base film is formed on the silicon oxide film, various kinds of circuits, elements, and wirings are formed. When various kinds of circuits, elements, wirings are formed, a film including hydrogen (an amorphous silicon film, a silicon nitride film, a DLC film or the like) is formed, and separation can occur within the layer or at the interface of a crystallized tungsten oxide film in a later separation step by performing a process having a heat treatment of 400° C. or more. When a TFT is formed, an active layer may be formed by using an amorphous silicon film including hydrogen.

In addition, in the case of a wiring or the like, after a silicon nitride film including hydrogen is formed to cover a wiring, separation can occur by performing a heat treatment of 400° C. or more. Alternatively, after an amorphous silicon film including hydrogen is formed to cover a wiring and a heat treatment of 400° C. or more is performed therein, the silicon film may be etched and removed.

Note that, in the above separation methods, a substrate is not required to be light-transmitting, and there is no particular limitations on the substrate as long as the substrate can withstand a heat treatment of 400° C. or more.

A structure of the present invention to realize the above described structures is a method of manufacturing a semiconductor device, having a first step of forming a layer to be separated including an inductor, a capacitor, a resistor element, a SAW element, or a TFT over a first substrate; a second step of applying an organic resin film that is soluble in a solvent, over the layer to be separated; a third step of attaching a second substrate to the organic resin film by a first two-sided tape and sandwiching the layer to be separated and the organic resin film with the first substrate and the second substrate; a fourth step of separating the first substrate from the layer to be separated by a physical means; a fifth step of attaching a third substrate to the layer to be separated by an adhesive agent and sandwiching the layer to be separated with the second substrate and the third substrate; a sixth step of separating the layer to be separated and the first two-sided tape from the second substrate; a seventh step of separating the layer to be separated from the first two-sided tape; an eighth step of removing the organic resin film by the solvent; and a tenth step of connecting an electrode provided in the third substrate and an electrode provided in the layer to be separated.

In the above described structure, one feature is that a method of connecting the electrode provided in the third substrate and the electrode provided in the layer to be separated is a soldering method, a method by an adhesive agent containing electrical conductive particles, a thermocompression method, a wire bonding method, or a flip chip method.

Another structure of the present invention regarding the method of manufacturing is a method of manufacturing a semiconductor device, having a first step of forming a layer to be separated including an embedded wiring over a first substrate; a second step of forming an inductor, a capacitor, a resistor element, a SAW element, or a TFT and an extraction electrode connected to the elements over a second substrate; a third step of attaching the second substrate to the layer to be separated by an adhesive agent and sandwiching the layer to be separated with the first substrate and the second substrate; and a fourth step of separating the first substrate from the layer to be separated by a physical means.

In the above described structure, the embedded wiring is formed by a first step of forming an etching stopper layer having an electric conductivity on an insulating surface; a second step of forming a first insulating film covering the etching stopper; a third of etching the first insulating film and forming an opening that reaches the etching stopper; a fourth step of forming a seed, performing plating and forming an embedded wiring covering the opening; and a fifth step of performing a planarizing process.

It should be noted that a heat treatment of 400° C. or more may be performed after a planarizing process so that the layer to be separated can be easily separated, although separation does not occur even when the planarizing process (such as CMP) is performed in the step of forming the embedded wiring.

In the above described structure, one feature is that the embedded wiring is copper, silver, gold or an alloy of them.

According to the present invention, various functions can be given to a mobile terminal. For example, a layer to be separated including a CPU circuit and a circuit having a GPS function is formed on a substrate according to the present invention, the layer to be separated is separated from the substrate, and can be transferred to and mounted on a circuit board. Alternatively, a layer to be separated including a circuit having a GPS function is formed on a substrate, the layer to be separated can be separated from the substrate, transferred to a substrate provided with a CPU circuit, and laminated for integration. Note that GPS (Global Positioning System) is a system for receiving a signal transmitted from a satellite for GPS, obtaining the time difference, and positioning based on it.

In addition, the present invention can be applied to a multilayer lamination component used for a high frequency circuit, for example, a coupler, a mixer, a distributor, a VCO (a voltage controlled oscillator), a chip antenna and the like.

Effect of the Invention

According to the present invention, further weight saving, thinning, lower cost, mounting area reduction can be realized, and various complex circuits can be integrated.

INDUSTRIAL APPLICABILITY

According to the present invention, a part or all parts of an electronic device can be manufactured by an assembly to which a plastic sheet provided with various functional circuits or elements is connected, and further lightweight of an information terminal device is realized

DETAILED DESCRIPTION OF THE INVENTION

Embodiment Modes of the present invention are described hereinafter.

Embodiment Mode 1

An example is shown here, in which a laminated capacitor or a laminated inductor is formed without using a semiconductor substrate, transferred to and mounted on a circuit board (printed board).

First, a heat-resisting glass substrate (e.g. a quartz substrate) or a ceramics substrate is prepared.

Figure 2:
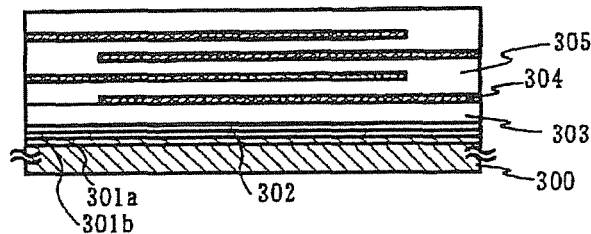
FIGS. 2A-2D are views showing Embodiment Mode 1.
Figure 2:
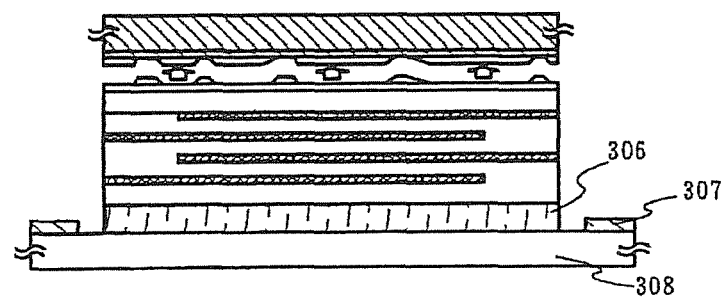
Figure 2:
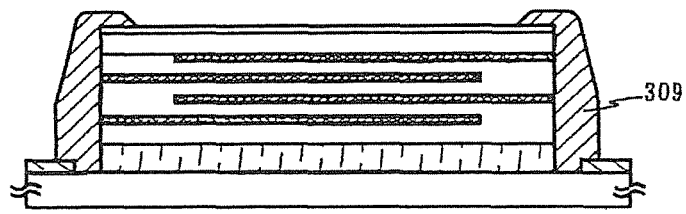
Figure 2:
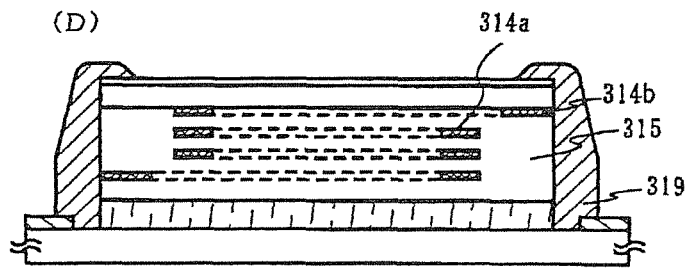

An example which a laminated capacitor is formed on a substrate (a first substrate 300) is described with reference to FIGS. 2 (A) to 2 (C). A ceramic substrate is employed in this embodiment since baking at a high temperature is performed. A metal film 301a, here, a tungsten film (from 10 nm to 200 nm in the film thickness, preferably, from 50 nm to 75 nm) is formed by a sputtering method on this ceramic substrate, and further, an oxide film 302, here a silicon oxide film (from 150 nm to 200 nm in the film thickness) is laminated without being exposed to the air. The film thickness of the oxide film 302 is preferably equal to or more than twice the film thickness of the metal film. Note that in laminating, a metal oxide film (a tungsten oxide film) in an amorphous state is formed with about from 2 nm to 5 nm in thickness between the metal film 301a and the silicon oxide film 302. In separating it in a later step, separation occurs within the tungsten oxide film, at an interface between the tungsten oxide film and the silicon oxide film, or at an interface between the tungsten oxide film and the tungsten film.

The deposited tungsten film, oxide tungsten film, and silicon oxide film on an edge face of the substrate are preferably removed selectively by $O_2$ ashing, since they are formed on the edge face of the substrate by a sputtering method.

Then, a silicon oxynitride film (100 nm in film thickness) (not shown in the figure) to be a base insulating film is formed by a PCVD method, and further a silicon nitride film including hydrogen (100 nm in film thickness) is laminated as a hydrogen containing film 303 without being exposed to the air.

Then, a paste for an internal electrode layer and a paste for a dielectric layer are laminated by a sheet method or a printing method, and then baked. Here is shown an example in which a paste for an internal electrode layer and a paste for a dielectric layer are printed and laminated by using a printing method, and cut into a predetermined shape, and then, separated from the substrate to form a green chip.

Ceramic of an alumina system having a favorable high frequency property, ceramic of a $BaTiO_3$ system in paste form, or the like is used for a material of a dielectric layer 305. Copper, silver, nickel, tin, zinc, Pd, aluminum or the like is used for a material of an internal electrode 304, and is laminated so that each edge face thereof is alternately exposed in facing two surfaces of a capacitor chip body. (FIG. 2 (A)) Note that the bake temperature is from 850° C. to 1400° C. Further, a metal oxide film 301b having a crystal structure is obtained in baking.

Then, it is bonded to a circuit board or a film 308 by an adhesive agent 306. Note that a terminal 307 or a wiring (not shown in the figure) is formed in the circuit board or the film, and various circuits or chips can be mounted thereon.

Then, the first substrate 300 is separated. Separation occurs within the tungsten oxide film, at an interface between the tungsten oxide film and the silicon oxide film, or at an interface between the tungsten oxide film and the tungsten film (FIG. 2 (B)).

Then, after the tungsten oxide left on the surface is removed, an external electrode 309 is formed. The external electrode 309 is formed by burning of a conductive paste and plating. Note that the tungsten oxide left on the surface is not needed to be removed, and there are no particular limitations on it. A capacitor circuit is configured by forming a paste for the external electrode on the facing two surfaces of the capacitor chip body. (FIG. 2 (C)) A terminal is connected at the same time as forming the external electrode 309 here, but after the external electrode 309 is formed, a connection with the terminal may be performed with an electrode or a solder for connecting.

Note that a capacitor is an element that has a great demand for so-called decoupling use, which is used between a power supply line and a ground for a stabilization of a power supply or an EMC measure in each circuit block.

In addition, an inductor can be also formed similarly.

According to the method for forming a capacitor, a tungsten film and a silicon oxide film are laminated by a sputtering method on a ceramic substrate, and a tungsten oxide film is formed in forming the silicon oxide film. A silicon oxynitride film (100 nm in film thickness) (not shown in the figure) to be a base insulating film is formed by a PCVD method, and further a silicon nitride film including hydrogen (100 nm in film thickness) is laminated as a hydrogen containing film without being exposed to the air.

Then, a paste for an internal electrode layer and a paste for a magnetic material layer are laminated by a sheet method or a printing method, and then baked.

A substance that Ni—Cu—Zn system ferrite, Mn—Mg—Zn system ferrite are kneaded into paste form by a binder such as a methyl cellulose or butyral resin is used for a material of a magnetic material layer 315. Copper, silver, nickel, tin, zinc, Pd, aluminum or the like is used for a material of an internal electrode 314a and laminated in a coiled shape. Note that it is laminated so that an extraction electrode portion 314b of the internal electrode in a coiled shape is exposed in an edge face.

Then, it is bonded to a circuit board or a film by an adhesive agent.

Then the first substrate is separated. Separation occurs within the tungsten oxide film, at an interface between the tungsten oxide film and the silicon oxide film, or at an interface between the tungsten oxide film and the tungsten film.

Then, after removing the tungsten oxide left on the surface, a terminal electrode 319 is formed. The terminal electrode 319 is formed by burning of a conductive paste and plating. An inductor circuit is configured by forming a paste for the terminal electrode on facing two surfaces of an inductor chip body (FIG. 2 (D)).

In addition, an LC filter can be formed by laminating the capacitor and the inductor integrally. A complex lamination body can be formed by laminating for forming an inductor portion after laminating for forming a capacitor portion, according to the above method for manufacturing.

According to the present invention, an LPF (Low Pass Filter) that is representative as an LC filter can be formed. An LPF is a high frequency circuit included in a module such as a cellular phone and is employed for a use of removing harmonic components of a power amplifier, an antenna switch or a VCO. An LPF comprises two Ls (inductors), and five Cs (capacitors). A suitable zero point is provided in an attenuation band of two LC parallel resonant circuits, and second harmonic, third harmonic of passage frequency are removed with a good balance, and an insertion loss of the passband as LPF is optimized to be minimized by setting impedance to 50Ω by a Cs (capacitors) disposed in input and output.

In addition to an LPF, various kinds of an LC filter, for example, a BPF, a diplexer, a coupler (a directional coupler), a balun and the like, can be manufactured by combining a capacitor or an inductor.

Embodiment Mode 2

An example in which a capacitor element and a TFT are formed, transferred to and mounted on a circuit board (printed board) is shown here.

Note that the same reference numerals are used for the same portions, since up to a halfway step is performed similarly to Embodiment Mode 1.

A tungsten film 301a and a silicon oxide film 302 are laminated by a sputtering method over a first substrate 300, and a tungsten oxide film in an amorphous state is formed in forming the silicon oxide film. A silicon oxynitride film (100 nm in film thickness) (not shown in the figure) to be a base insulating film is formed by a PCVD method, and further an amorphous silicon film including hydrogen (55 nm in film thickness) is laminated as a hydrogen containing film without being exposed to the air. Herein, a quartz substrate is used as the first substrate 300.

A hydrogen concentration of the amorphous silicon film including hydrogen was measured through FT-IR. As a result, Si—H was $1.06 \times 10^{22}$ (atoms/cm$^3$), Si—H$_2$ was $8.34 \times 10^{19}$ (atoms/cm$^3$), and the calculated hydrogen concentration in the composition ratio was 21.5%. Further, the hydrogen concentration was similarly calculated under the changed film deposition conditions of a PCVD method, as a result of which the obtained hydrogen concentrations in the composition ratio were 16.4%, 17.1%, and 19.0%.

Thereafter, the amorphous silicon film is crystallized by using a known technique (such as a solid-phase growth method, a laser crystallization method, a crystallization method using catalyst metal) to form an element using a TFT having a polysilicon film as an active layer. Herein, a polysilicon film is obtained by a crystallization method using a catalyst metal. A nickel acetate salt solution containing nickel of 10 ppm by weight is applied by a spinner. Note that nickel elements may be applied on the entire surface by sputtering instead of applying. Then, a heat treatment is carried out for crystallization to form a semiconductor film having a crystal structure (here, a polysilicon layer). Herein, a silicon film having a crystal structure is obtained by a heat treatment for crystallization (at 550° C. for 4 hours) after the heat treatment (at 550° C. for one hour).

Figure 11A:
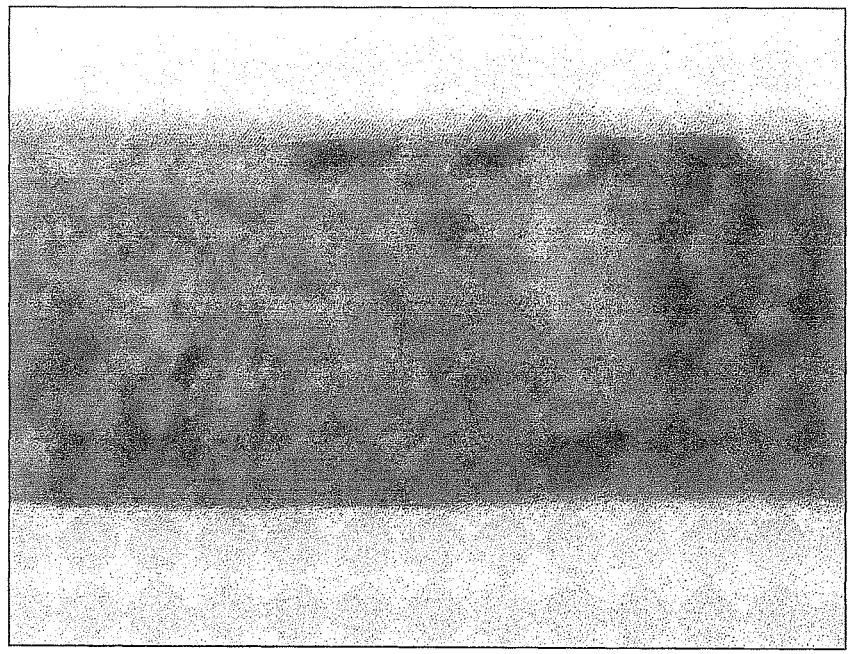
FIGS. 11A-11B are views showing a cross section TEM picture before separation. (Embodiment Mode 2)
Figure 11B:
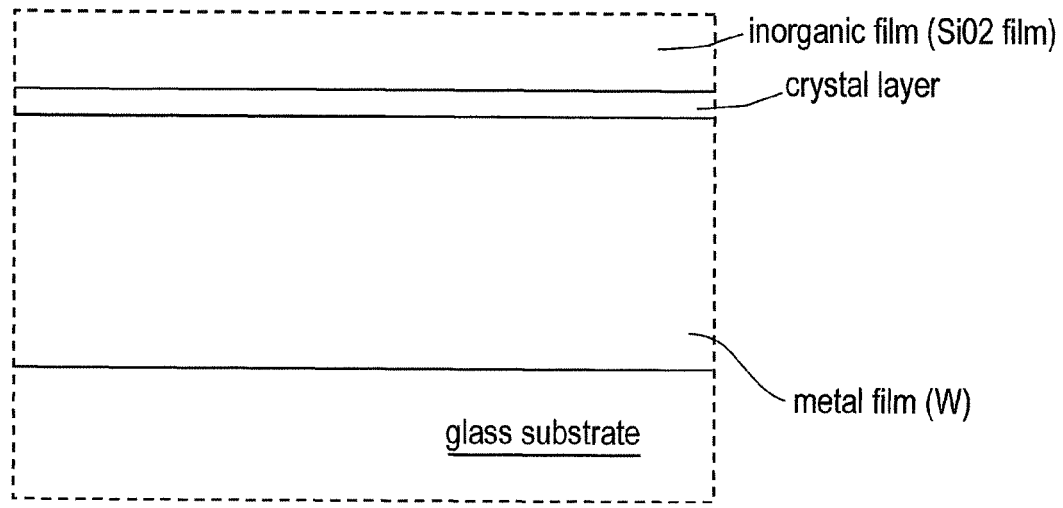

The amorphous silicon film contains hydrogen. In the case of forming a polysilicon film by heating, a heat treatment of at least 410° C. is performed thereby diffusing hydrogen as well as forming the polysilicon film. An amorphous metal oxide film is crystallized by a heat treatment of at least 400° C. As a result, a metal oxide film 301b having a crystal structure can be obtained. FIG. 11 shows a cross-sectional TEM picture. Accordingly, the metal oxide film having a crystal structure is formed and hydrogen is diffused by performing a heat treatment of at least 410° C. After the heat treatment of at least 410° C. is finished, the separation in the tungsten oxide film, or at an interface between the tungsten oxide film and the silicon oxide film, or an interface between the tungsten oxide film and the tungsten film can be achieved with relatively little force (for example, human hands, wind pressure of a gas blown from a nozzle, ultrasonic waves, or the like). Note that, when a heat treatment is performed at a temperature enough to obtain a metal oxide film having a crystal structure, the thickness of the metal oxide film is thinned slightly.

Various elements typified by a TFT (a thin film diode, a silicon-based pin-junction photoelectric transducer, a silicon resistor element, or a sensor element (typically, a pressure-sensitive fingerprints sensor using polysilicon)) can be also formed by using the obtained polysilicon film.

Next, after the oxide film on the surface of the silicon film having a crystal structure is removed by dilute hydrofluoric acid or the like, irradiation of laser light (XeCl: wavelength of 308 nm) for raising a degree of crystallization and repairing defects left in crystal grains is performed in the atmosphere or in an oxygen atmosphere. Excimer laser light with a wavelength of 400 nm or less, or second harmonic wave or third harmonic wave of a YAG laser is used for the laser light. Here, pulsed laser light with a repetition frequency of approximately 10 to 1000 Hz is used, the laser light is condensed to 100 to 500 mJ/cm$^2$ by an optical system, and irradiation is performed with an overlap ratio of 90 to 95%, thereby the silicon film surface may be scanned. Here, the irradiation of the laser light is performed in the atmosphere with a repetition frequency of 30 Hz and energy density of 470 mJ/cm$^2$. Note that an oxide film is formed on the surface by the laser light irradiation since the irradiation is conducted in the atmosphere or in an oxygen atmosphere. Though an example of using the pulsed laser is shown here, a continuous wave laser may also be used. When crystallization of an amorphous semiconductor film is conducted, it is preferable that the second harmonic through the fourth harmonic of basic waves is applied by using a solid state laser which is capable of continuously oscillating in order to obtain a crystal in a large grain size. Typically, it is preferable that the second harmonic (532 nm) or the third harmonic (355 nm) of an Nd:YVO$_4$ laser (basic wave of 1064 nm) is applied. In the case of using a continuous wave laser, laser light emitted from the continuous wave type YVO$_4$ laser with 10 W output is converted into harmonics by using non-linear optical elements. Also, a method of emitting harmonics by applying YVO$_4$ crystal and the non-linear optical elements into a resonator can be cited. Then, preferably, the laser light is formed so as to have a rectangular shape or an elliptical shape on an irradiated face by an optical system, thereby irradiating an object to be treated. At this time, the energy density of approximately 0.01 to 100 MW/cm$^2$ (preferably 0.1 to 10 MW/cm$^2$) is required. The semiconductor film may be moved at approximately 10 to 2000 cm/s rate relatively corresponding to the laser light so as to be irradiated.

Then, a barrier layer made of an oxide film having a thickness of 1 to 5 nm in total is formed by treating the surface with ozone water for 120 seconds, in addition to the oxide film formed by this laser light irradiation. The barrier layer is formed in order to remove nickel that is added for crystallization from the film. Though the barrier layer is formed by using ozone water here, a barrier layer may be formed by depositing an oxide film of about 1 to 10 nm thick by a method of oxidizing a surface of a semiconductor film having a crystal structure by ultraviolet irradiation in an oxygen atmosphere, a method of oxidizing a surface of a semiconductor film having a crystal structure by an oxygen plasma treatment, a plasma CVD method, a sputtering method, a vapor deposition or the like. Further, before forming the barrier layer, the oxide film formed by laser light irradiation may be removed.

On the barrier layer, an amorphous silicon film containing an argon element is formed to be 10 nm to 400 nm thick, herein, 100 nm thick by sputtering to serve as a gettering site. Here, the amorphous silicon film containing an argon element is formed under an atmosphere containing argon with using a silicon target. When a plasma CVD method is used for forming the amorphous silicon film containing an argon element, the deposition condition is as follows: a flow ratio of monosilane to argon (SiH$_4$:Ar) is set to be 1:99; a deposition pressure is set to be 6.665 Pa (0.05 Torr); an RF power density is set to be 0.087 W/cm$^2$; a deposition temperature is set to be 350° C.

Thereafter, a furnace heated at 650° C. is used for a heat treatment for three minutes for gettering to reduce the nickel concentration in the semiconductor film having a crystal structure. A lamp annealing apparatus may be used instead of the furnace.

Subsequently, the amorphous silicon film containing the argon element, which is a gettering site, is selectively removed with the barrier layer as an etching stopper, and then, the barrier layer is selectively removed by dilute hydrofluoric acid. Note that there is a tendency that nickel is likely to move to a region with a high oxygen concentration in gettering, and thus, it is desirable that the barrier layer made of the oxide film is removed after gettering.

Note that, in the case where crystallization using a catalytic element is not performed, the above described steps such as the formation of a barrier layer, the formation of a gettering site, a heat treatment for gettering, the removal of a gettering site, and the removal of a barrier layer are not necessary.

Then, after a thin oxide film is formed with ozone water on the surface of the obtained silicon film having a crystal structure (also referred to as polysilicon film), a mask made of resist is formed, and an etching treatment is conducted to obtain a desired shape, thereby forming the island-like semiconductor layers separated from one another. After the formation of the semiconductor layers, the mask made of resist is removed.

Next, the oxide film is removed with an etchant containing hydrofluoric acid, and at the same time, the surface of the silicon film is washed. Thereafter, an insulating film containing silicon as its main component, which serves as a gate insulating film, is formed. In this embodiment, a silicon oxynitride film (composition ratio: Si=32%, 0=59%, N=7%, H=2%) is formed to have a thickness of 115 nm by a plasma CVD method.

Thereafter, a gate electrode is formed over a gate insulating film, and formation of a source region or a drain region by doping to an active layer, formation of an interlayer insulating film (an inorganic insulating film), formation of a source electrode or a drain electrode, an activation treatment, a hydrogenation treatment etc. are performed appropriately, thereby forming a top gate TFT 403 which has a polysilicon film as an active layer. When phosphorus imparting n-type is added as an impurity element to be doped, an n-channel TFT can be formed. When boron imparting p-type is added, a p-channel TFT can be formed. A CMOS circuit can be manufactured by combining these TFTs.

Note that the example of a top gate type is shown as a structure of a TFT here, but the structure of a TFT may be a bottom gate type or a sequence staggered type, for example, specifically without being limited.

Then, an interlayer insulating film covering the TFT is formed, and a capacitor 404 comprising a lower electrode 404a, a high dielectric thin film 404b and an upper electrode 404c is formed over the interlayer insulating film. For the high dielectric thin film (dielectric thin film having a high dielectric constant) 404b, BST (BaSrTiO$_3$), STO (SrTiO$_3$) or PZT (PbZrTiO$_3$) may be employed. A heat treatment of 600 to 700° C. is performed to obtain these high dielectric thin films. Note that a metal material which is stable to a material of the high dielectric thin film is used for the lower electrode 404a or the upper electrode 404c.

Then, an interlayer insulating film covering the capacitor is formed, and a contact hole is formed in the interlayer insulating film to form an extraction electrode. An extraction electrode connected to a TFT, an extraction electrode connected with the lower electrode of the capacitor, an extraction electrode connected with the upper electrode thereof, and the like are each formed herein (FIG. 3 (A)).

Next, an adhesive agent that is soluble in water or alcohol is applied over the whole surface and baked. The composition of the adhesive agent may be any composition, for example, epoxy series, acrylate series, silicone series, and the like. Here, a resin layer (a thickness of 30 μm) formed of water-soluble resin (TOAGOSEI Co., Ltd.: VL-WSHL10) 410 is spin-coated, and exposed to light for two minutes to be temporarily cured, then, exposed its back to UV rays for 2.5 minutes, and then, exposed its surface for 10 minutes, namely, it is fully cured by the light-exposure of 12.5 minutes in total. The water-soluble resin film serves as a planarizing film. Thus, when the substrate is bonded later, it is possible that a surface of the planarizing film and the substrate face are almost parallel to each other. When this water soluble resin film is not used, there is a danger that the unevenness by an electrode or a TFT is generated in pressure-bonding.

Then, a second substrate 412 is bonded to the resin layer 410 by using an adhesive layer (two-sided tape) 411 (FIG. 3(B)). Note that an adhesive agent that can be separated by ultraviolet irradiation may be used instead of the two-sided tape.

Figure 12A:
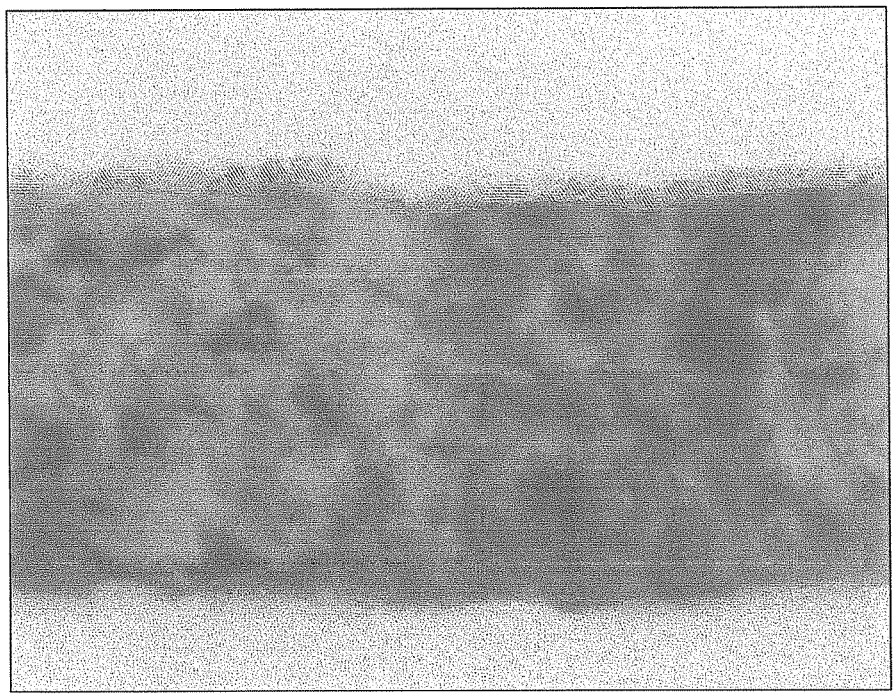
FIGS. 12A-12B are views showing a cross section TEM picture after separation. (Embodiment Mode 2)
Figure 12B:
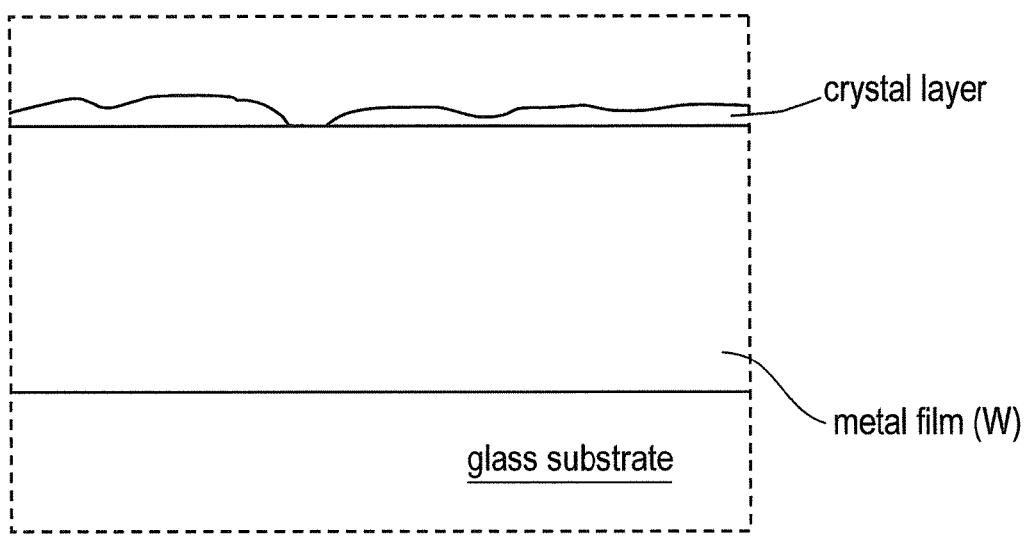

The first substrate 300 provided with the metal film 301a is separated by a physical means. The first substrate 300 can be separated with relatively little force (for example, human hands, wind pressure of a gas blown from a nozzle, ultrasonic waves, or the like). Thus, a layer to be separated formed on the silicon oxide layer 302 can be separated from the first electrode 300. FIG. 3(C) shows a state after the separation. Note that FIG. 12 shows a cross-sectional TEM picture of the first substrate after the separation. The TEM pictures in FIG. 12 and FIG. 11 show different parts and they do not correspond to each other. As shown in FIG. 12, the oxide tungsten film is partly thin and partly nonexistent. The tungsten oxide film partly remains in the separated layer; however, it is transparent, and thus the tungsten oxide film may not removed or removed.

Figure 3:
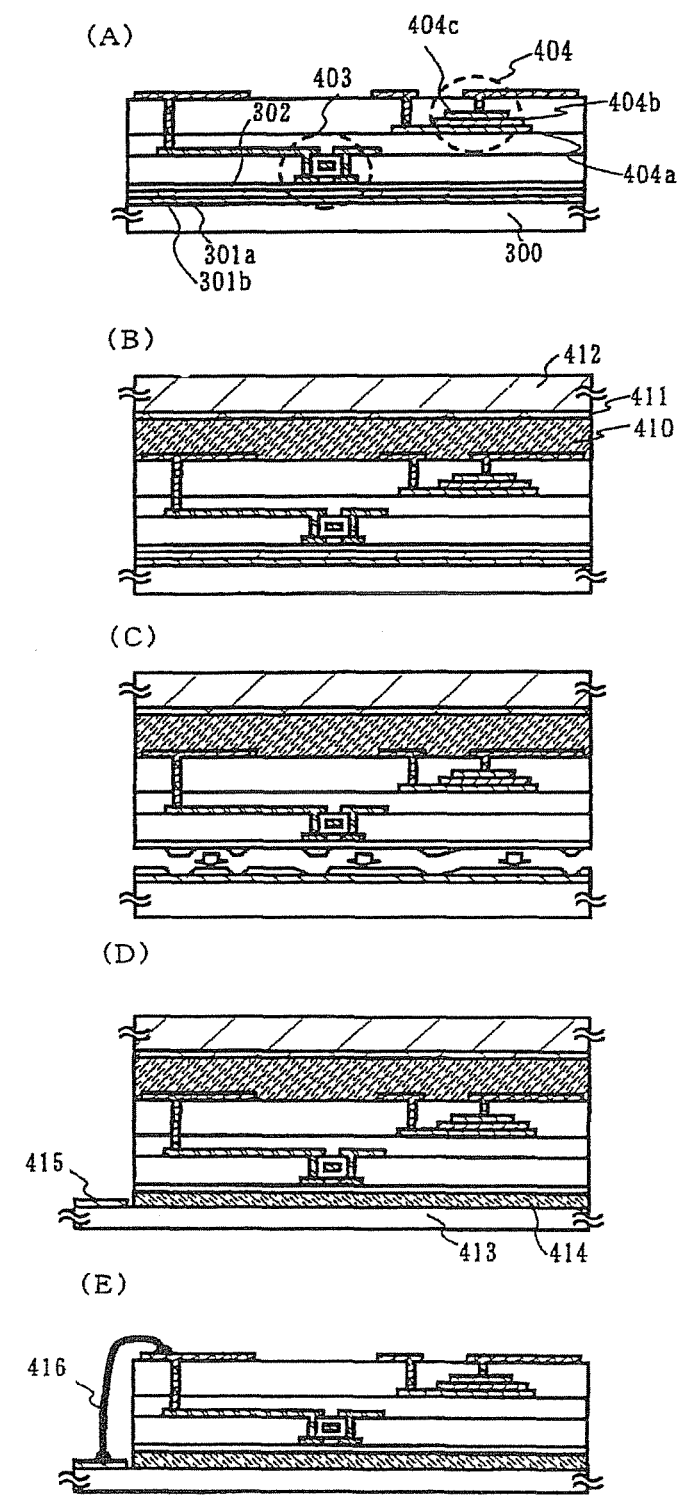
FIGS. 3A-3E are views showing Embodiment Mode 2.

Then, it is bonded to a circuit board or a film 413 by an adhesive agent 414 (FIG. 3 (D)). A terminal 415 or a wiring (not shown in the figure) is formed in the circuit board or the film, and various circuits or chips can be mounted thereon.

Then, the second substrate 412 is separated from the two sided tape 411, and the two-sided tape is peeled. And the resin layer 410 made of water soluble resin is dissolved in water and removed.

Then, a bonding wire 416 for connecting an extraction electrode and the terminal 415 is formed. Alternatively, the extraction electrode and the terminal 415 may be connected by soldering or a conductive adhesive agent.

By the present invention, a layer to be separated including a capacitor element and a TFT can be mounted on a circuit board. A nonvolatile RAM or a high integration DRAM can be manufactured without using a semiconductor substrate by applying the present invention.

In addition, an operational amplifier (op-amp) in which an n-channel TFT or a p-channel TFT is appropriately combined, can be manufactured.

Further, this embodiment mode can be combined with Embodiment Mode 1, and the inductor shown in Embodiment Mode 1 can be laminated, for example, and thus various high frequency circuits can be realized.

Embodiment Mode 3

Figure 4:
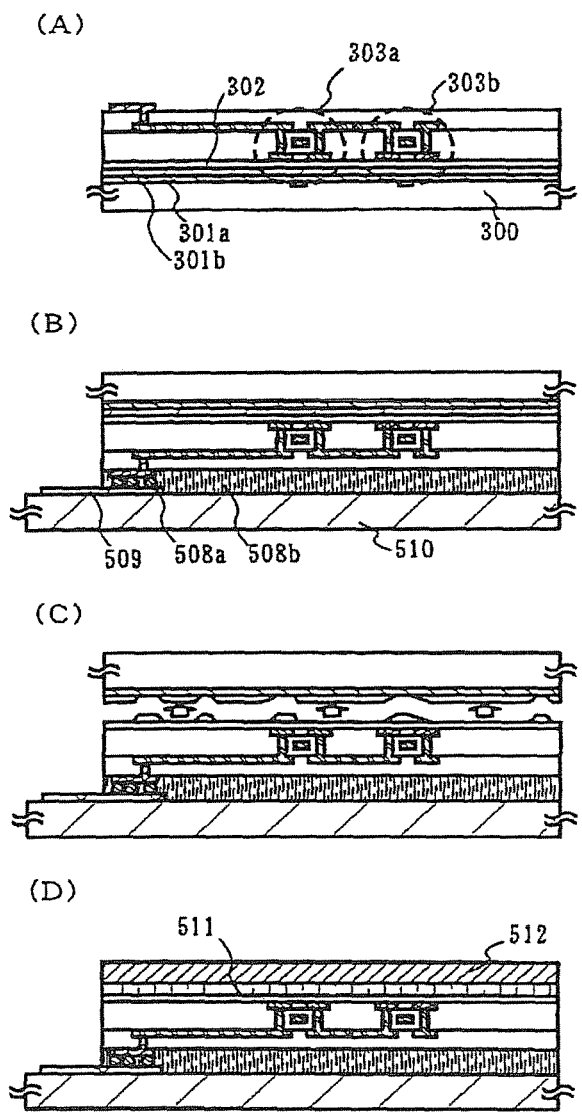
FIGS. 4A-4D are views showing Embodiment Mode 3.

An example of a mounting method that is different from that shown in Embodiment Mode 2 is shown in FIG. 4 herein.

Here, a CMOS circuit in which a p-channel TFT 303a and an n-channel TFT 303b are complementarily combined is formed.

First, the p-channel TFT 303a and the n-channel TFT 303b are formed on a first substrate according to Embodiment Mode 2 (FIG. 4 (A)). Since it is possible that the process temperature in forming a CMOS circuit is controlled to be equal to or less than 600° C., a glass substrate can be used in this embodiment mode for the first substrate 300.

When a state of FIG. 4 (A) is obtained, a circuit board 510 provided with a terminal 509 is bonded to the first substrate 300 by an adhesive agent 508b containing electrical conductive particles 508a (FIG. 4(B)). The terminal 509 and an extraction electrode connected to a TFT are electrically connected via the electrical conductive particles by bonding them.

Then, the first substrate 300 is separated. Separation occurs within the tungsten oxide film, at an interface between the tungsten oxide film and the silicon oxide film, or at an interface between the tungsten oxide film and the tungsten film (FIG. 4 (C)).

Then, after removing the tungsten oxide left on the surface, a heat sink 512 is bonded by an adhesive agent 511 (FIG. 4 (D)). Specifically, when a highly integrated circuit such as a CPU circuit is formed by using a CMOS circuit, since heat easily generates, it is useful to bond the heat sink for radiating heat of an element. Note that the heat sink is not necessarily provided in the case of an integrated circuit to which heat generation does not matter.

In addition, this embodiment mode can be freely combined with Embodiment Mode 1 or Embodiment Mode 2, and various complex integrated circuits can be realized without using a semiconductor substrate.

Embodiment Mode 4

Figure 5:
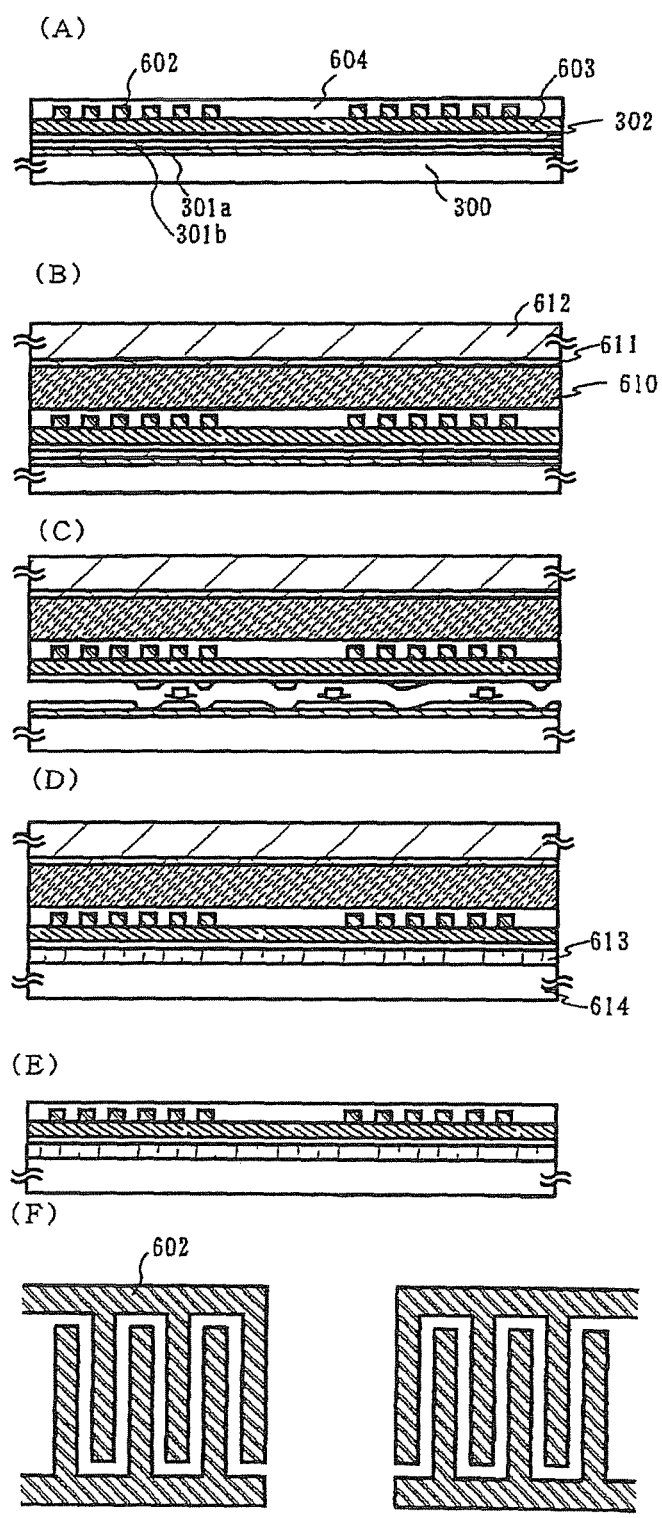
FIGS. 5A-5F are views showing Embodiment Mode 4.

Herein, an example in which a surface acoustic wave (SAW) element is formed, transferred to and mounted on a circuit board (printed board) without using a semiconductor substrate, is shown in FIG. 5. The SAW element has a structure in which a surface wave propagation film and a piezoelectric film are laminated, and a surface wave is excited to the surface wave propagation film by applying an electric field to the piezoelectric film by a comb type electrode, and oscillating.

Note that the same reference numerals are used for the same elements, since up to a halfway step is performed similarly to Embodiment Mode 1.

A tungsten film 301a, a silicon oxide film 302 are laminated by a sputtering method over a first substrate 300, and in the case of forming the silicon oxide film, a tungsten oxide film in an amorphous state is formed. A silicon oxynitride film (100 nm in film thickness) (not shown in the figure) to be a base insulating film is formed by a PCVD method, and further a surface wave propagation film 603 is laminated without being exposed to the air. Note that herein a quartz substrate is used as the first substrate 300 and a DLC film containing hydrogen (10 to 50 μm in film thickness) is used as the surface wave propagation film 603. A film formation method of the DLC film is not limited particularly, and may be a CVD method, a microwave CVD method, a PVD method, a sputtering method, an ion plating method or the like.

Then, a comb type electrode 602 is formed. The comb type electrode 602 is not limited specifically, as far as it is a conductive material. In addition, the thickness of the comb type electrode 602 is preferably around 10 to 500 nm. In addition, a plane shape of the comb type electrode 602 may be a single electrode shown in FIG. 5 (F), or may be a double electrode. In addition, the example in which the comb type electrode 602 is formed on the surface wave propagation film 603 is shown here, but a depression may be formed in the surface wave propagation film 603 to bury it.

Then, a piezoelectric material film 604 is formed (FIG. 5(A)). ZnO, MN, a quartz crystal, $LiNbO_3$, $LiTaO_3$ or the like may be employed for the piezoelectric material film 604. The thickness of this piezoelectric material film 604 can be selected appropriately depending on the type of material or intended characteristics (such as center frequency, fractional band width, temperature characteristic) of a surface acoustic wave element. A film formation method of the piezoelectric material film 604 may be a CVD method, a microwave CVD method, a PVD method, a sputtering method, an ion plating method or the like, without being limited specifically.

Then, an adhesive agent that is soluble in water or alcohols is applied to the entire surface and baked. For example, an epoxy system, an acrylate system, a silicone system and the like may be used for a composition of this adhesive agent. Herein, a resin layer 610 (film thickness of 30 μm) made of water soluble resin (VL-WSHL10 made by TOAGOSEI CO., LTD) is applied by spin-coating and cured. This water soluble resin film functions as a planarizing film. Thus, when the substrate is bonded later, it is possible that a surface of the planarizing film and the substrate face are almost parallel to each other. When this water soluble resin film is not used, there is a danger that the unevenness by an electrode of a TFT is generated in pressure-bonding.

Then, a second substrate 612 is bonded to the resin layer 610 by using an adhesive layer (a two-sided tape) 611 (FIG. 5(B)). Note that an adhesive agent that can be peeled off by ultraviolet irradiation, for example, may be used instead of the two-sided tape.

Then, the first substrate 300 for which the metal film 301a is provided is separated by a physical means. Note that it can be separated with relatively little force (for example, human hands, wind pressure of a gas blown from a nozzle, ultrasonic waves, or the like) by heating at 400° C. or more in a treatment during or after forming a DLC film. Thus, a layer to be separated formed over the silicon oxide layer 302 can be separated from the first substrate 300. FIG. 5(C) shows a state after the separation. The tungsten oxide film which has been partially left on the layer to be separated may be removed or not, since it is transparent.

Then, a circuit board or a film 614 is bonded by an adhesive agent 613 (FIG. 5(D)). A terminal or a wiring (not shown in the figure) is formed on the circuit board or the film so that various circuits or chips can be mounted thereon.

According to this embodiment mode, a SAW element which employs a plastic film as a support medium can be manufactured, and when it is bonded to a plastic film having a wiring, their coefficients of thermal expansion can be adjusted to each other and thus, a warp of the whole device can be prevented.

The second substrate 612 is separated from the two-sided tape 611, then two-sided tape is peeled. The resin layer 610 made of the water soluble resin is dissolved and removed by using water (FIG. 5(E)). FIG. 5(F) shows a top view.

According to the present invention, a layer to be separated including a surface acoustic wave element (a SAW element) can be mounted on a circuit board. This surface acoustic wave element can be applied to a filter, a delay line, an oscillator, a resonator, a convolver and a correlator and the like, and typically, is interposed between stages of transmitting and receiving and can constitute a BPF (bandpass filter) removing an unnecessary frequency component, in a high frequency circuit of a cellular phone. Further, a SAW element can manufacture a duplexer for combining a BPF having a transmitting frequency in a passband and a BPF having a receiving frequency in a passband and sharing an antenna terminal.

In the surface acoustic wave element, an electrode for a short-circuit may be formed if necessary. The electrode for a short-circuit is an electrode having a function to change SAW characteristics of the element by making the electric field equipotential. Further, in the surface acoustic wave element, a protective film may be formed if necessary.

This embodiment mode can be freely combined with Embodiment Modes 1 to 3.

Embodiment Mode 5

An example of forming a semiconductor resistor element, transferring it to a circuit board (printed board), and mounting it thereon without using a semiconductor substrate, is described herein.

Note that the same reference numerals are used for the same elements, since up to a halfway step is performed similarly to Embodiment Mode 1.

A tungsten film 301a, a silicon oxide film 302 are laminated by a sputtering method over a first substrate 300, and in the case of forming the silicon oxide film, a tungsten oxide film in an amorphous state is formed. A silicon oxynitride film (100 nm in film thickness) (not shown in the figure) to be a base insulating film is formed by a PCVD method, and further an amorphous silicon film including hydrogen (50 to 100 nm in film thickness) is laminated as a semiconductor film 702 without being exposed to the air. Herein, a quartz substrate is used as the first substrate 300.

Then, a heat treatment of 400° C. or more is performed to crystallize a metal oxide film in an amorphous state and obtain a metal oxide film 301b having a crystal structure. Alternatively, a polysilicon film may be formed by heating at 600° C. or more. Then, an n-type impurity element (such as phosphorus) or a p-type impurity element (such as boron) is doped into the semiconductor film 702 to obtain a desired resistance value.

Then, after the semiconductor film is made to have a desired shape, a wiring, an interlayer insulating film and an extraction electrode are formed (FIG. 6(A)). FIG. 6(E) shows a top view and FIG. 6(F) shows an equivalent circuit diagram. Note that resistance value of a semiconductor resistor element is determined by width W, length L, and sheeting resistance value of a semiconductor portion that is to be a resistor.

Figure 6:
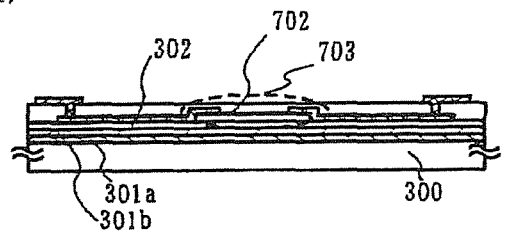
FIGS. 6A-6F are views showing Embodiment Mode 5.
Figure 6:
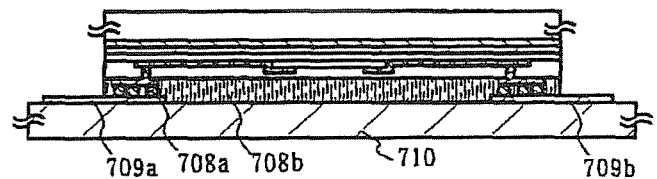
Figure 6:
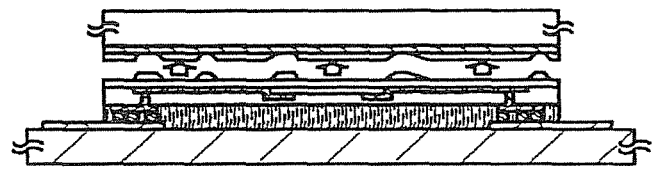
Figure 6:
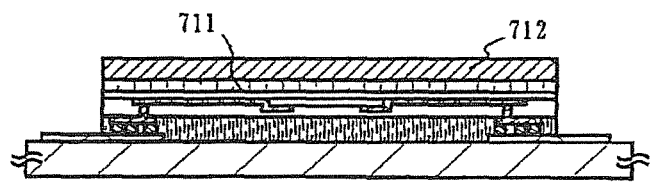
Figure 6:
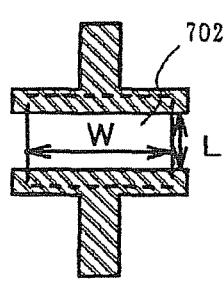
Figure 6:

When the state of FIG. 6(A) is obtained, a circuit board 710 provided with terminals 709a and 709b is bonded to the first substrate 300 by an adhesive agent 708b including electrical conductive particles 708a (FIG. 6 (B)). The terminals 709a and 709b are electrically connected to an extraction electrode connected to the semiconductor film 702 via the electrical conductive particles by bonding them.

Then, the first substrate 300 is separated. Separation occurs within the tungsten oxide film, at an interface between the tungsten oxide film and the silicon oxide film, or at an interface between the tungsten oxide film and the tungsten film (FIG. 6 (C)).

Then, after removing the tungsten oxide left on the surface, a heat sink 712 is bonded by an adhesive agent 711. Specifically, resistance of the semiconductor resistor element is determined by generating heat, thus it is useful to bond the heat sink for radiating heat of an element.

In addition, a thin film resistor element can be formed by using a material such as $TaN_x$ or NiCr, as well as the above semiconductor resistor element.

This embodiment mode can be freely combined with Embodiment Modes 1 to 4. For example, when it is combined with Embodiment Mode 2, a capacitor having a large capacity, a TFT and a semiconductor resistor element can be manufactured simultaneously.

Embodiment Mode 6

Figure 7:
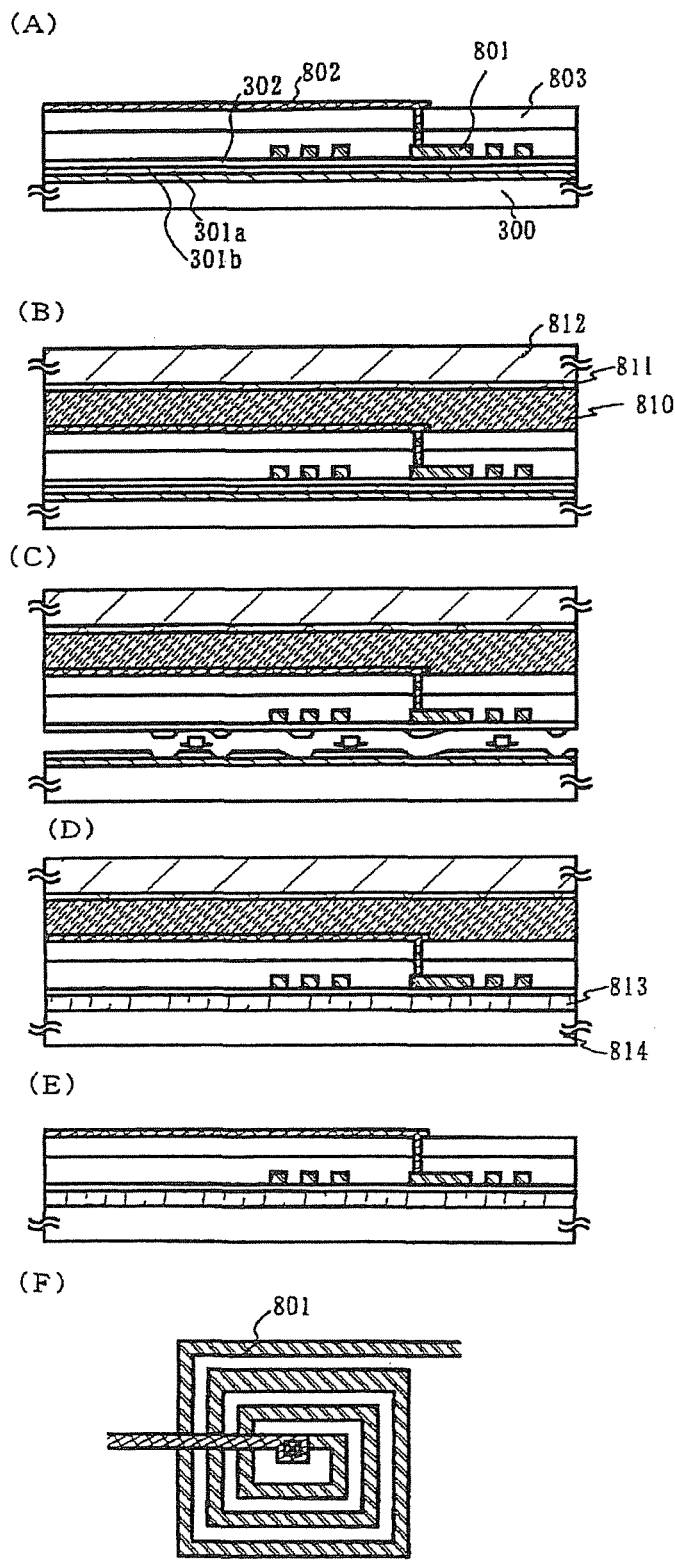
FIGS. 7A-7F are views showing Embodiment Mode 6.

Herein, an example in which a spiral inductor is formed, transferred to a circuit board (printed board) and mounted thereon is shown in FIG. 7. The spiral inductor is an inductor that is wound in spiral like with a transmission line of high impedance, imaging a winding electric coil.

Note that the same reference numerals are used for the same elements, since up to a halfway step is performed similarly to Embodiment Mode 1.

A tungsten film 301a, a silicon oxide film 302 are laminated by a sputtering method over a first substrate 300, in the case of forming the silicon oxide film, a tungsten oxide film in an amorphous state is formed. A silicon oxynitride film (100 nm in film thickness) (not shown in the figure) to be a base insulating film is laminated by a PCVD method.

Then, a transmission line 801 is formed. The transmission line 801 is not limited specifically, as far as it is a conductive material. Herein, the transmission line is wound up in spiral like about three times at regular intervals.

Subsequently, an interlayer insulating film, a hydrogen containing film 803 and an extraction electrode 802 are formed (FIG. 7(A)). Note that FIG. 7 (F) shows a top view. A silicon nitride film containing hydrogen is used for the hydrogen containing film 803.

Then, an adhesive agent that is soluble in water or alcohols is applied to the entire surface and baked. For example, an epoxy system, an acrylate system, a silicone system or the like may be used for a composition of this adhesive agent. Herein, a resin layer 810 (film thickness of 30 μm) made of water soluble resin (VL-WSHL10 made by TOAGOSEI CO., LTD) is applied by spin-coating and cured. This water soluble resin film functions as a planarizing film. Thus, when the substrate is bonded later, it is possible that a surface of the planarizing film and the substrate face are almost parallel to each other. When this water soluble resin film is not used, there is a danger that the unevenness by an electrode or a TFT is generated in pressure-bonding.

Then, a second substrate 812 is bonded to the resin layer 810 by using an adhesive layer (a two-sided tape) 811 (FIG. 7(B)). Note that an adhesive agent that can be peeled off by ultraviolet irradiation, for example, may be used instead of the two-sided tape.

Then, the first substrate 300 for which the metal film 301a is provided is separated by a physical means. Note that it can be separated with relatively little force (for example, human hands, wind pressure of a gas blown from a nozzle, ultrasonic waves, or the like) by heating at 400° C. or more in a treatment during or after forming the hydrogen containing film 803. Thus, a layer to be separated formed over the silicon oxide layer 302 can be separated from the first substrate 300. FIG. 7(C) shows a state after the separation. The tungsten oxide film which has been partially left on the layer to be separated may be removed or not, since it is transparent.

Then, a circuit board or a film 814 is bonded by an adhesive agent 813 (FIG. 7(D)). A terminal or a wiring (not shown in the figure) is formed on the circuit board or the film so that various circuits or chips can be mounted thereon.

Then, the second substrate 812 is separated from the two sided tape 811, and the two sided tape is peeled. And the resin layer 810 made of water soluble resin is dissolved by using water and removed (FIG. 7(E)). Through the above described steps, the spiral inductor can be mounted on the circuit board or the film 814.

According to this embodiment mode, a spiral inductor which employs a plastic film as a support medium can be manufactured, and when it can be bonded to a plastic film having a wiring, their coefficients of thermal expansion can be adjusted to each other, and thus a warp of the whole device can be prevented.

Further, plural spiral inductors may be combined.

This embodiment mode can be freely combined with Embodiment Modes 1 to 5.

Embodiment Mode 7

Figure 8:
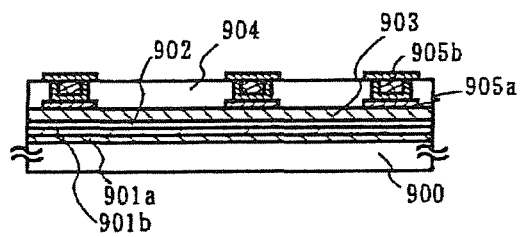
FIGS. 8A-8E are views showing Embodiment Mode 7.
Figure 8:
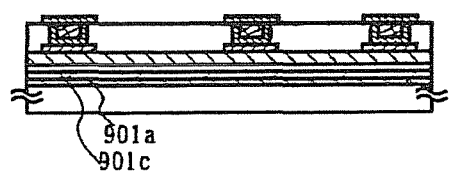
Figure 8:
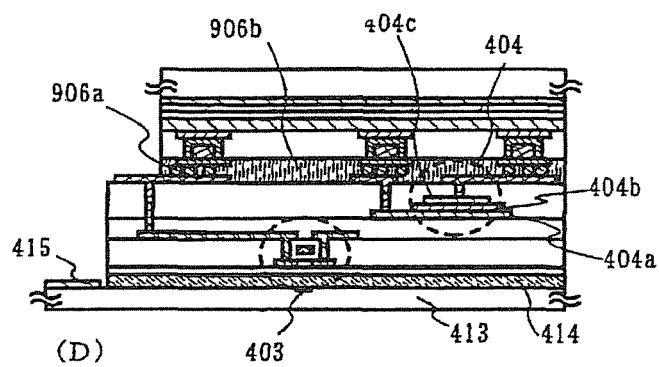
Figure 8:
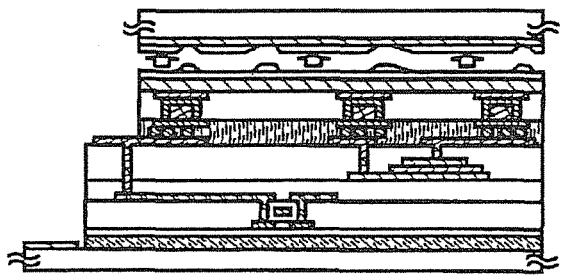
Figure 8:
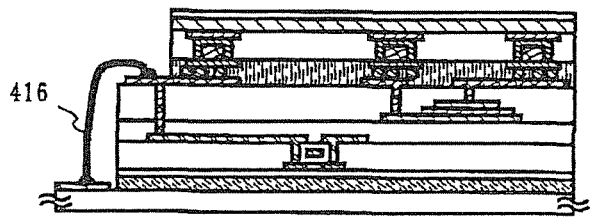

In FIG. 8, an example in which an embedded wiring is formed, transferred onto and mounted on the circuit board (printed board) obtained in Embodiment Mode 2, is shown herein. An insulating layer is formed, an embedded wiring (Cu, Au, Ag, Ni, chrome, palladium, rhodium, tin, lead or an alloy thereof or the like) is formed in the insulating layer. After a surface of the insulating layer is flattened, a metal protective film (such as Ti, TiN, Ta, TaN) is formed in an exposed portion.

Initially, a metal film 901a, herein a tungsten film (film thickness of 10 nm to 200 nm, preferably, 50 nm to 75 nm) is formed by a sputtering method on a substrate 900 having an insulating surface, and further an oxide film 902, herein a silicon oxide film (film thickness of 150 nm to 200 nm) is laminated without being exposed to the air. Note that a metal oxide film (tungsten oxide film) 901b of about 2 nm to 5 nm thick that is an amorphous (in an amorphous state) is formed between the metal film 901a and the silicon oxide film 902, in laminating them. A substrate whose surface is flat is preferably used for the substrate 900 having an insulating surface, since an embedded wiring is formed in a later step.

Then, a silicon oxynitride film (film thickness of 100 nm) (not shown in the figure) to be a base insulating film is formed by a PCVD method, an amorphous silicon film (film thickness of 50 nm) containing hydrogen is laminated for a hydrogen containing film 903 without being exposed to the air.

Then, an etching stopper layer 905a is formed. An element selected from Ni, Ti, W, WSi$_x$, Al, Mo, Ta, Cr or Mo, or an alloy material mainly containing the element described above, a film mainly containing a compound material or a laminated film thereof may be used for the etching stopper layer 905a. The etching stopper layer 905a is also a seed layer (cathode by plating) of an electrolytic plating treatment to be performed later. Further, a seed layer may be formed over the etching stopper layer 905a separately. Then, an insulating film containing mainly silicon covering the etching stopper layer 905a is formed.

Then, pattering is performed, the insulating film is selectively etched to form an opening (groove) that reaches the etching stopper layer 905a. Then, after a first barrier layer is formed, an electrolytic plating treatment is conducted to form a low resistance metal film having an adequate thickness in the opening (groove). The electrolytic plating treatment is a method by which a metal film is formed in a cathode face by applying a direct current into a solution including a metal ion to be formed by plating. A material having low electric resistance, e.g. copper, silver, gold, chrome, iron, nickel, platinum or an alloy thereof can be used as a metal to be plated. The thickness of the metal film formed by the electrolytic plating method can be determined appropriately by a practitioner by controlling current density and time. Because the electric resistance of copper is extremely low, an example of using copper (Cu) that can be electrolytic-plated as the low resistance metal film is shown here. Further, the first barrier layer is a prevention layer of diffusion for copper that diffuses quickly in the insulating film 904 mainly containing a silicon oxide, in other words, a barrier metal. A metal material having the specific resistance value of about 300 to 500 μΩ cm or less, (WN$_x$, TaN$_x$, TiSi$_x$N$_y$, WSi$_x$N$_y$, TaSi$_x$N$_y$, etc.) is desirably used for the first barrier layer. In addition, since copper has unfavorable adhesiveness with the insulating film 904 containing mainly a silicon oxide, it is effective to form the first barrier layer having favorable adhesiveness.

By performing a planarizing process typified by chemical mechanical polishing (hereinafter, referred to as a CMP method), copper and the first barrier layer are left in only the opening (a groove), and an unnecessary portion is removed to form an embedded type wiring (hereinafter, an embedded wiring) 905b. Note that the adhesiveness at an interface of the metal oxide film 901b is favorable, since it is amorphous, even when CMP is performed thereon; therefore separation does not occur.

Then, a second barrier layer is formed to enhance oxidation resistance of the exposed copper (FIG. 8(A)). Further, the second barrier layer is also effective as a prevention layer of diffusion for copper that diffuses quickly in the insulating film 904 mainly containing a silicon oxide. A silicon nitride film or a metal material (TiN, NbN, $WN_x$, $TaN_x$, $TiSi_xN_y$, $WSi_xN_y$, $TaSi_xN_y$, etc.) is desirably used for the second barrier layer. In addition, since copper has unfavorable adhesiveness with the insulating film containing mainly silicon oxide, it is effective to form the second barrier layer having favorable adhesiveness.

Then, a heat treatment is performed so as to easily separate a layer to be separated from the first substrate in a later separation step (FIG. 8(B)). This heat treatment crystallizes the metal oxide film 901b to form a metal oxide film 901c having a crystal structure, and diffuses hydrogen included in the hydrogen containing film 903. Note that a heat treatment may be performed at 400° C. for one hour or more in the case of using a tungsten film as the metal film 901a.

Moreover, an alloy, e.g., a W—Mo alloy, is used as the metal film 901a, and the degree of separation can be changed by adjusting the composition ratio. In addition, nitrogen may be injected into the metal oxide film by an ion implantation method or an ion doping method so as not to be easily separated, or a treatment for easily separating by injecting oxygen may be performed.

Then, the first substrate 900 for which an embedded wiring 905b is provided is bonded to a circuit board 413 for which a capacitor element (capacitor 404) and a TFT 403 obtained in Embodiment Mode 2 are provided by an adhesive layer 414 (FIG. 8(C)). The same reference numerals are used for the same portion as that in Embodiment Mode 2. The electrical conduction of the embedded wiring and an electrode that is connected to the capacitor 404, and the electrical conduction of the embedded wiring and an electrode connected to the TFT 403 are made by bonding by using an adhesive agent 906b including electrical conductive particles 906a.

In addition, when a high dielectric thin film 404b is formed, it is difficult to lower resistance value of a wiring, since a highly heat-resisting material is used for the wiring because a heat treatment is conducted at a relatively high temperature. A complex circuit provided with a low resistance wiring can be provided by bonding the embedded wiring in this embodiment mode as a leading wiring portion.

Then, the first substrate 900 for which the metal film 901a is provided is separated by a physical means. It can be separated with relatively little force (for example, human hands, wind pressure of a gas blown from a nozzle, ultrasonic waves, or the like). Thus, a layer to be separated formed over the silicon oxide layer 902 can be separated from the first substrate 900. FIG. 8(D) shows a state after the separation. The tungsten oxide film which has been partially left on the layer to be separated may be removed or not, since it is transparent.

Then, a bonding wiring 416 to connect an extraction electrode and a terminal 415 is formed, like Embodiment Mode 2. In addition, the extraction electrode and the terminal 415 may be connected by soldering or a conductive adhesive agent.

Through the above described steps, the layer to be separated that is provided with a low resistance embedded wiring and that includes a capacitor element and a TFT can be mounted on a circuit board to be overlapped. Further, an embedded wiring pattern is formed, and connection points to the circuit board can be reduced by overlapping the layer to be separated to be connected, depending on it. In addition, by bonding the low resistance embedded wiring, a complicated circuit having a leading wiring can be simplified.

Herein, an example of using an embedded wiring of the present invention as a leading wiring is shown, but is not limited to this in particular. It is can be used for various wirings such as source wiring, a leading out wiring, a power supply line and a capacitor wiring to lower resistance of a wiring.

By using an embedded wiring of the present invention, a spiral inductor, an antenna pattern, a ground pattern and the like can be manufactured.

This embodiment mode can be freely combined with Embodiment Modes 1 to 6.

Embodiment Mode 8

Various functional circuits can be formed by using one of the above described embodiment modes 1 to 7 and mounted on a circuit board 100 without using a semiconductor substrate, according to the present invention. A ceramic board (such as alumina) and a resin system substrate (such as FR-4) may be employed for the circuit board 100.

Herein, FIG. 9(A) shows a perspective view of a module having a high frequency circuit (front end portion) and a CPU to be mounted on an information terminal such as a cellular phone.

The front end portion is formed by integrating two antenna switches, two LPFs, and one diplexer. The antenna switch is formed from two diodes, two inductors and five capacitors. The diplexer is located in an inlet from an antenna and it is a filter element with three ports for separating two frequency spectrums of a dual band. The diplexer is formed from a HPF that passes the high frequency side and an LPF that passes the low frequency side. The LPF of the diplexer is formed from two Ls (inductors) and three Cs (capacitors) and the HPF of the diplexer is formed from one L (inductor) and three Cs (capacitors).

For example, a plurality of capacitors obtained in Embodiment Mode 1 are mounted as a first layer including a functional circuit 101; a CPU using a CMOS circuit obtained in Embodiment Mode 2 and a memory formed in Embodiment Mode 3 is mounted as a second layer including a functional circuit 102; an antenna switch comprising a diode, an inductor and a capacitor obtained in Embodiment Modes 1 and 2 is mounted as a third layer including a functional circuit 103; an antenna pattern is mounted as a fourth layer including a functional circuit 104; a plurality of inductors obtained in Embodiment Mode 1 are mounted as a fifth layer including a functional circuit 105; a plurality of resistors obtained in Embodiment Mode 5 are mounted as a sixth layer including a functional circuit 106; and each of them are connected appropriately by a wiring pattern 114 and the front end portion and the CPU are formed on the circuit board 100 by combining the elements. The CPU controls the whole device.

Noise can be reduced by integrating various circuits like this.

Further, it is possible to form and mount various types of filter circuits, a processing circuit for audio or video, various types of interface circuits and the like, in a similar way, without using a semiconductor substrate.

For example, a VCO (voltage controlled oscillator) which determines an oscillator condition can be formed by appropriately arranging a TFT as an oscillator, a varicap diode for varying voltage and a capacitor, an inductor, and a resistor in the periphery thereof, in the circuit board 100.

A high frequency circuit is exemplified here, but it is possible to further integrate, and mount a flash memory, a solar battery, a sensor element, a light-emitting element and the like on the same circuit board, in addition to the high frequency circuit.

A top face of the circuit board may be covered with mould resin or a protective case. Further, a lead (a pin) may be arranged from the side.

An example of mounting on the circuit board is shown herein, but it is not limited particularly. It is also possible to mount on a glass substrate, a plastic film or the like for which a display portion, a wiring or a circuit is provided.

Figure 9:
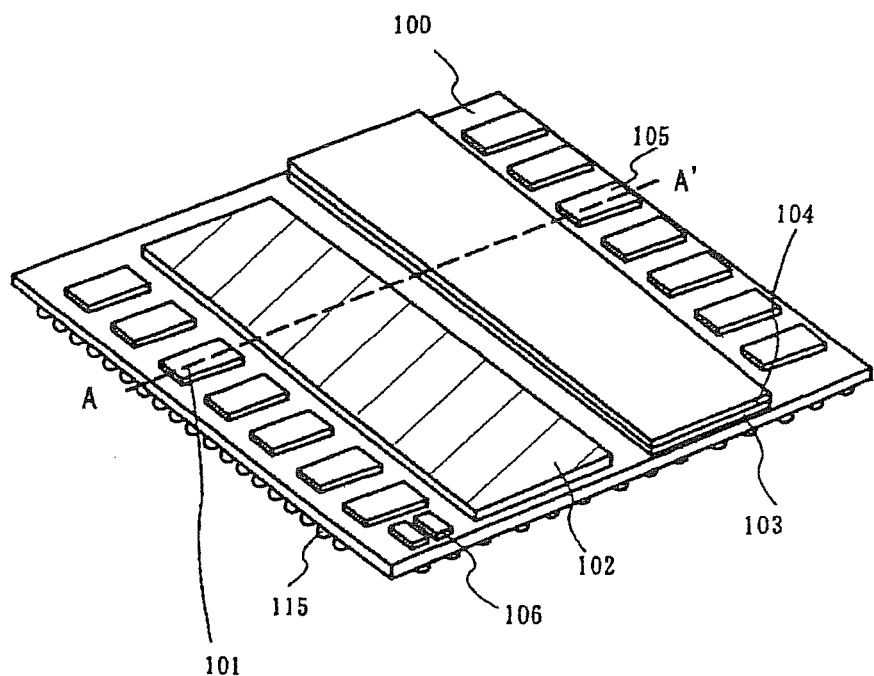
FIGS. 9A-9B are view showing Embodiment Mode 8.
Figure 9:
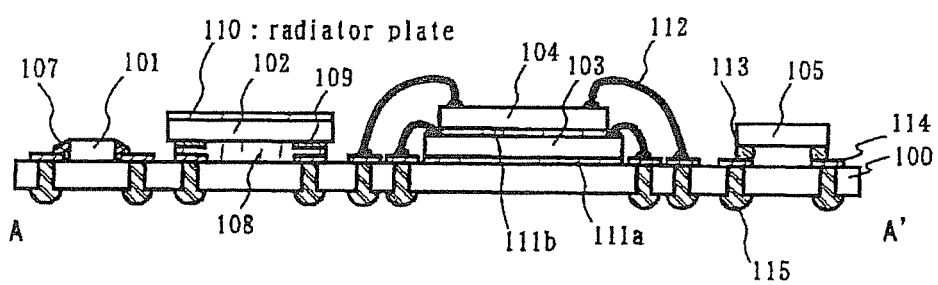

FIG. 9 (B) is a cross-sectional view taken along a dotted line A-A' in FIG. 9(A). In FIG. 9 (B), the first layer having a functional circuit 101 is electrically connected to the wiring pattern 114 and mounted by a solder 107. Moreover, the second layer including a functional circuit 102 is fixed with an adhesive agent 108 including electrical conductive particles, and an electrode 109 provided for the second layer including a functional circuit 102 is connected to the wiring pattern 114 with electrical conductive particles. In addition, the third layer including a functional circuit 103 is fixed with an adhesive agent 111a, and is connected to the wiring pattern 114 with a wire 112 by a wire bonding method. The fourth layer including a functional circuit 104 is fixed to the third layer including a functional circuit 103 with an adhesive agent 111b, and is connected to the wiring pattern 114 with a wire 112 formed by a wire bonding method. The fifth layer including a functional circuit 105 is connected to the wiring pattern 114 with a bump 113 formed by a transfer bump method. Note that the wiring pattern 114 is connected to a solder ball 115 that is to be an external terminal through a through-hole that is formed in the circuit board 100. There are an ultrasonic solder bump forming method, a solder bump forming method by electroless plating, a solder bump forming method by a transfer method and the like as a method for forming the solder ball 115.

An example of mounting by various mounting methods is shown in FIG. 9, but one mounting method may be standardized or the methods may be selected appropriately.

Embodiment Mode 9

Figure 1:
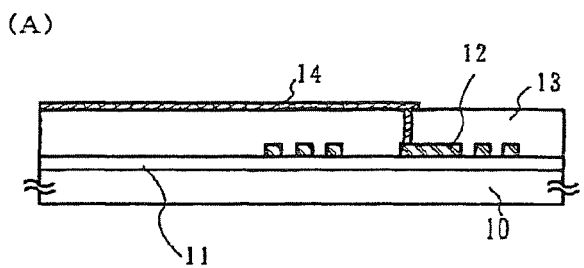
FIGS. 1A-1E are views showing Embodiment Mode 9.
Figure 1:
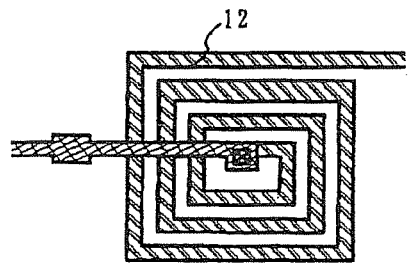
Figure 1:
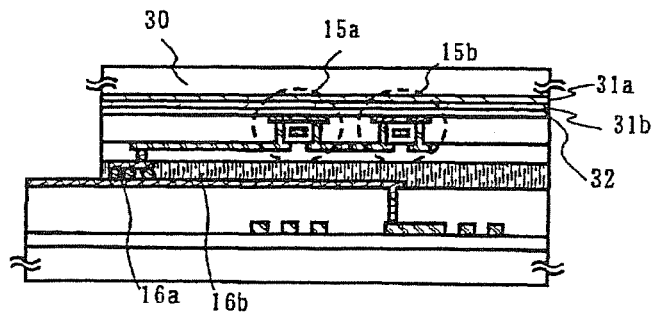
Figure 1:
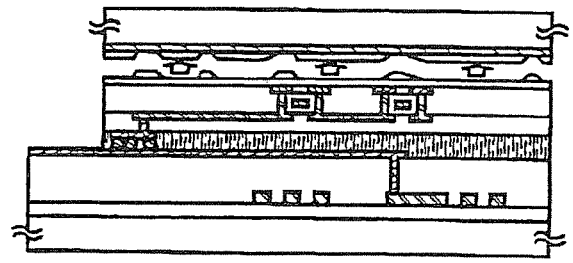
Figure 1:
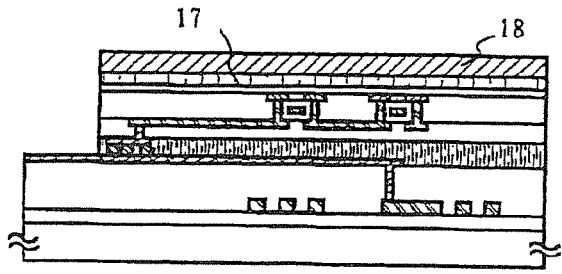

Herein, an example in which a spiral inductor and a TFT are laminated is shown in FIG. 1.

Initially, a base insulating film 11 is formed on a first substrate 10. Then, a transmission line 12 is formed. The transmission line 12 is not limited specifically, as long as it is a conductive material. Herein, the transmission line is wound up in spiral like about three times at regular intervals. The first substrate 10 may be a glass substrate, a plastic substrate, a ceramic substrate or a quartz substrate.

Then, an interlayer insulating film 13 and an extraction electrode 14 are formed (FIG. 1(A)). Note that FIG. 1(B) shows a top view.

A second substrate 30 in which an n-channel TFT 15a and a p-channel TFT 15b are formed is bonded by an adhesive agent 16b including electrical conductive particles 16a (FIG. 1(C)). The extraction electrode 14 is connected to the n-channel TFT 15a or the p-channel TFT 15b by the electrical conductive particles 16a. Note that a tungsten film 31a and a silicon oxide film 32 are laminated over the first substrate 30 by a sputtering method. A tungsten oxide film in an amorphous state is formed in forming the silicon oxide film. A heat treatment of 400° C. or more is performed during the step of forming the TFTs 15a and 15b, a metal oxide film in an amorphous state is crystallized to obtain a metal oxide film 31b having a crystal structure.

Then, the first substrate 30 for which the metal film 31a is provided is separated by a physical means. It can be separated with relatively little force (for example, human hands, wind pressure of a gas blown from a nozzle, ultrasonic waves, or the like). Thus, a layer to be separated formed over the silicon oxide layer 32 can be separated from the first substrate 30. FIG. 1(D) shows a state after the separation.

Then, after removing the tungsten oxide left on the surface, a heat sink 18 is bonded by an adhesive agent 17. Specifically, when a highly integrated circuit such as a CPU circuit is formed by using a CMOS circuit, since heat easily generates, it is useful to bond the heat sink for radiating heat of an element. Note that the heat sink is not necessarily provided, in the case of an integrated circuit to which heat generation does not matter.

Through the above-mentioned steps, a spiral inductor and a CMOS circuit can be laminated and connected. Herein, the example of laminating the spiral inductor and the CMOS circuit is shown. However, it is possible to laminate two or more layers to be separated including various elements or wirings obtained in Embodiment Modes 1 to 7, and further to extract the electrodes or lead out the wirings to one another.

This embodiment mode can be freely combined with Embodiment Modes 1 to 8.

The present invention having the above-mentioned structures is further described in detail in Embodiments hereinafter.

Embodiment 1

Figure 10:
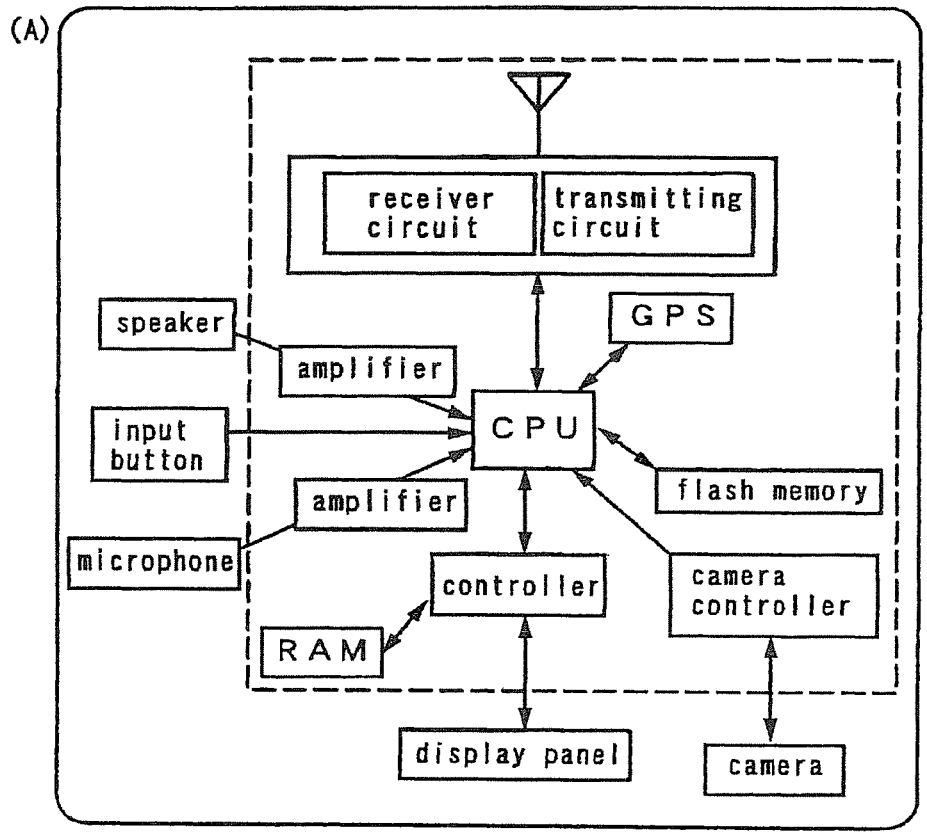
FIGS. 10A-10B are views showing Embodiment 1.
Figure 10:
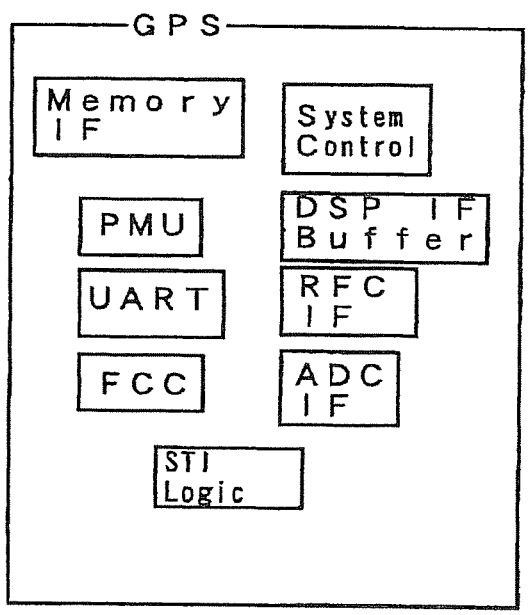

A cellular phone having a GPS function is described as an example in this embodiment with reference to FIG. 10.

In FIG. 10 (A), functional circuits such as an antenna, a receiver circuit, a transmitting circuit, and a GPS are formed, and further, a flash memory memorizing call-register, a camera controller, a controller connected to a display panel, a RAM and the like are provided. In addition, an amplifier for amplifying a signal from a microphone, an amplifier for amplifying a signal for outputting audio to a loudspeaker and the like are provided. Moreover, a CPU to be connected to them is provided.

According to the present invention, a circuit in the portion surrounded by a dotted line in FIG. 10(A) can be manufactured and mounted on a circuit board without using a semiconductor substrate. A capacitor, an inductor, a resistor element, a SAW element and the like that are each obtained according to any one of Embodiment Modes 1 to 7 are combined appropriately to manufacture each functional circuit.

Although not shown here, a signal processor (DSP) is provided.

A functional block constituting a GPS is shown in FIG. 10 (B). The GPS function includes a system control, a Memory IF (memory interface), a PMU (path memory unit), a UART (receiving portion), an FCC, a DSP IF Buffer (a DSP (signal processor) interface buffer), an RFC IF (Radio Frequency Choke coil interface), an ADC IF (A-D converter interface), STI Logic (Set Interrupt Logic) and the like.

Note that the functional blocks that are different from one another may be connected to one another by a glue logic (Glue Logic) that operates the functional circuit block in parallel coordination.

Some or all of circuits in the portion surrounded by the dotted line can be mounted on a display panel board.

An example of a cellular phone is shown here, but the present invention can be applied to other personal digital assistants, card (a telephone card, an ID card, a card having a circuit, or a card having a semiconductor element), a video camera, a digital camera, a goggle type display, a navigation device typified by a car navigation, a DVD player or an electronic game machine. As a result, further weight saving, thinning, cost reduction, and mounting area reduction can be realized.

This embodiment can be freely combined with Embodiment Modes 1 to 9.

Embodiment 2

Figure 13:
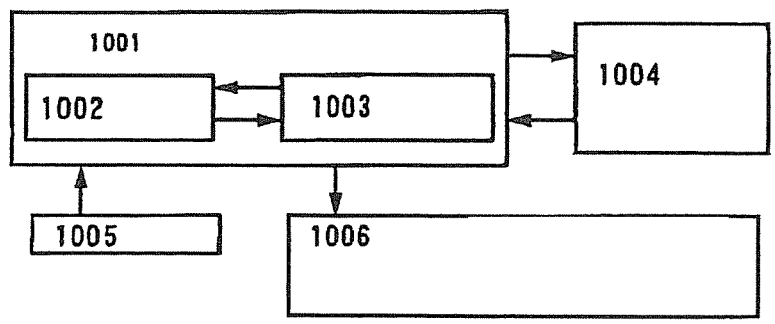
FIGS. 13A-13D are views showing Embodiment 2.
Figure 13:
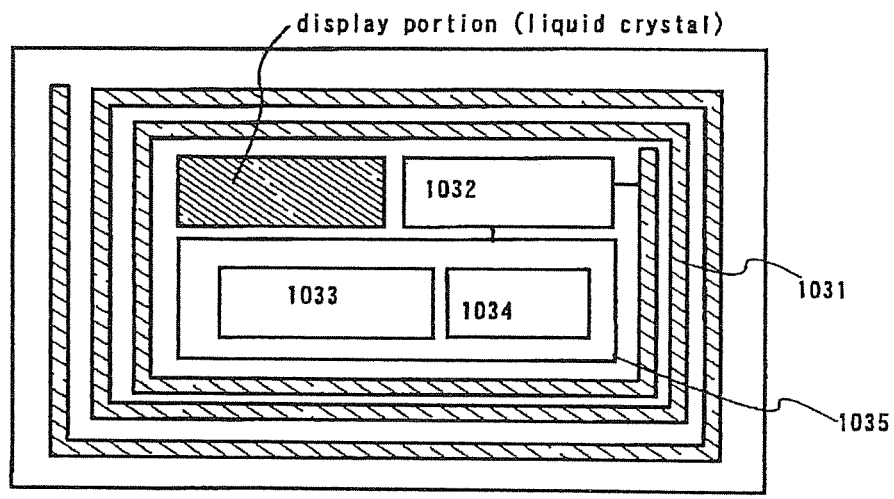
Figure 13:
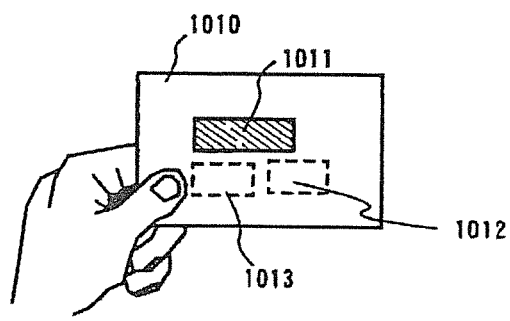
Figure 13:
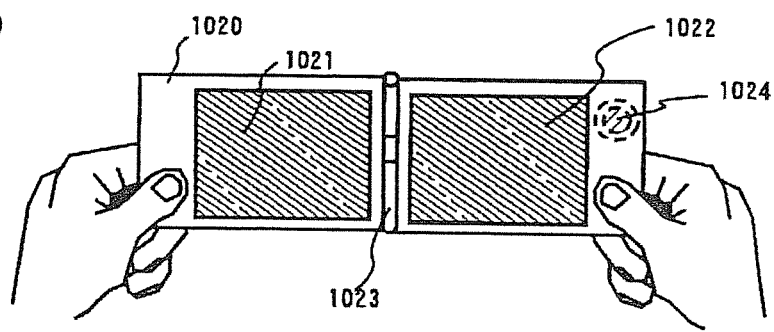

In FIG. 13 (A), reference numeral 1001 denotes a central processing unit (also, referred to as a CPU), 1002 denotes a control unit, 1003 denotes an operation part, 1004 denotes a memory unit (referred to as a memory), 1005 denotes an input unit, and 1006 denotes an output unit (such as a display portion).

The central processing unit 1001 includes the control unit 1002 and the arithmetic unit 1003. The operation part 1003 comprises an arithmetic logic unit (ALU) for performing arithmetic operations such as addition and subtraction, or logical operations such as AND, OR, and NOT, various registers for temporarily storing data or results of the operations, a counter for counting the number of 1 that are inputted, and the like. Circuits constituting the operation part 1003, such as an AND circuit, an OR circuit, a NOT circuit, a buffer circuit, a resistor circuit, can be formed from TFTs. For the sake of obtaining a high field effect mobility, a semiconductor film that has been crystallized by laser light of a continuous wave laser may be formed as an active layer of the TFT.

A tungsten film and a silicon oxide film are formed over a substrate by a sputtering method, then a base insulating film (a silicon oxide film, a silicon nitride film, or a silicon oxynitride film) is formed thereover, and then an amorphous silicon film is formed thereover. In a later step, separation is performed by using a tungsten oxide layer formed at the interface between the tungsten film and the silicon oxide film.

Crystallization methods are given as follows: a method of adding a metal element serving as a catalyst to an amorphous silicon film, heating it to obtain a polysilicon film and obtaining a polysilicon film by irradiating with laser light of a pulsed laser; a method of emitting laser light of a continuous wave laser on an amorphous silicon film to obtain a polysilicon film; a method of heating an amorphous silicon film to obtain a polysilicon film and irradiating it with laser light of a continuous wave laser to obtain a polysilicon film; or a method of adding a metal element serving as a catalyst to an amorphous silicon film, heating it to obtain a polysilicon film and obtaining a polysilicon film by irradiating with laser light of a continuous wave laser. In the case of using continuous wave laser light, the direction of a channel length of the TFT constituting the operation part 1003, the control unit 1002 or the memory unit 1004 is preferably the same as a scanning direction of the laser beam.

The control unit 1002 has a function of executing an instruction stored in the memory unit 1004 and controlling the whole operation. The control unit 1002 includes a program counter, an instruction register, and a control signal generating unit. The control unit 1002 can be also formed from TFTs and a crystallized semiconductor film may be manufactured as an active layer of the TFT.

The memory unit 1004 is a place for storing data and instructions for performing operations. Data or programs that are often executed in the CPU are stored therein. The memory unit 1004 includes a main memory, an address register, and a data register. A cache memory may be used in addition to the main memory. These memories may be formed from a SRAM, a DRAM, a flash memory, or the like. When the memory unit 1004 is formed from a TFT, a crystallized semiconductor film can be manufactured as active layers of the TFT.

The input unit 1005 is a device for receiving data or program from outside. The output unit 1006 is a device for displaying results, typically, a display device.

A layer to be separated including the thus obtained CPU (including a terminal electrode and a leading wiring) is separated from the substrate and transferred to a plastic substrate.

In addition, not only the CPU but also various circuits including a current circuit, a display portion, and a driver circuit unit can be formed together. For example, a card having a noncontact type thin film integrated circuit, a body-worn computer and the like can be manufactured.

FIG. 13(B) is a view of a card having a noncontact type thin film integrated circuit.

FIG. 13(B) is a top view showing the specific structure of the noncontact type thin film integrated circuit. It has a display portion, an antenna 1031, a current circuit 1032, an integrated circuit unit 1035 including a CPU 1033, a memory 1034, or the like, in which the antenna is connected to an IC via the current circuit. The current circuit 1032 may have at least a diode and a capacitor, and has a function for converting the alternate current frequency wave received by the antenna into the direct current. The antenna 1031 can be formed in the same step for forming the integrated circuit.

A feature of a noncontact type IC is that it is supplied with an electric power by an electromagnetic induction action (electromagnetic induction type) of a coiled antenna, a mutual induction action (electromagnetic coupling type), or a induction action by static electricity (electrostatic coupling type). The height of the received frequency can be selected by controlling the number of coil windings.

The frequency of remote type is micro wave; vicinity and proximity, 13.56 MHz; and close type, 4.91 MHz, generally. The number of coil windings can be reduced by increasing frequency and shortening wavelengths.

Compared with a contact type thin film integrated circuit, a noncontact type thin film integrated circuit is unbreakable, highly durable, and free from an error by static electricity or the like, since the noncontact type thin film integrated circuit carries out power source supply and information communication without contacting with a reader/writer. The structure of the reader/writer itself is not complicated. Further, the noncontact type one is easy to use, since what is necessary is to hold up the thin film integrated circuit to the reader/writer.

A noncontact type integrated circuit comprises a CPU, a memory, an I/O port, and a coprocessor, and exchanges data via a path. Further, the IC has an RF (radio frequency) interface and a noncontact interface. The reader/writer as a reading unit comprises a noncontact interface and an interface circuit, and carries out information communication and exchange between each the noncontact interface by communications or an electronic wave by holding up the IC to the reader/writer. Then, information communication and exchange is carried out by the interface circuit of the reader/writer with a host computer. Naturally, the host computer may have a reader/writer unit.

FIG. 13(C) is an external view of a plastic card corresponding to FIG. 13 (B). In FIG. 13(C), 1010 is a main body of a plastic card, 1011 is a display portion, 1012 is a memory unit, and 1013 is a CPU. In case of using it as an identification card, a lightweight and flexible card can be obtained. Further, when the identification card becomes useless, it is possible to easily cut and break it into parts and to make information in the memory unit unreadable completely and to prevent forge and copy the card.

If required, a battery (a sheet like battery or a solar battery) for driving a display portion or the like may be provided. A sheet like battery, a solar battery or the like can be manufactured by separating and transferring. The sheet-like battery is provided with plural solid power generation cells comprising power generation factors in which a positive electrode active material, a solid electrolyte, a negative electrode active material are stacked in layers on a sheet. For the positive electrode active material, the solid electrolyte and the negative electrode active material, carbon system materials such as a lithium cobalt oxide, a lithium nickel oxide, a lithium manganese oxide, a lithium vanadium oxide, a lithium titanium oxide, a metallic lithium, a lithium alloy, a manganese dioxide, graphite and coke, a niobium pentoxide, a lithium transition metal compound nitride, a PEO (polyoxyethylene oxide), lithium phosphate etc., can be used. Further, an electronic conduction material such as carbon, or acetylene black or an additional material such as a polymeric binder may be mixed into these materials.

The device shown in FIG. 13 (D) is an example of a personal digital assistant having a plurality of liquid crystal display portions.

The device shown in FIG. 13 (D) can be folded by a fold moving part 1023, and can have a business card size. The plurality of display portions can be protected as well as miniaturization of the device by folding it. A plastic 1020 is used for the main body and thus, it is light. The device has a left side display portion 1021 and a right side display portion 1022. The display portion may be provided with an imaging unit (solid imaging element such as CCD camera) 1024 on the backside. Data imaged by the imaging unit 1024 can be directly displayed on the left side display portion 1021 or the right side display portion 1022 via a camera interface portion or the like. The left side display portion 1021 and the right side display portion 1022 are each preferably a touch-panel so that a user can perform various input operations with it.

The main body of the plastic 1020 is provided with a main control section including a CPU for overall-controlling a display portion and each part of the main body etc., a memory unit, a display portion driver circuit, a power supply circuit portion, an operation input control part, a modulator-demodulator circuit portion, a transmitter-receiver circuit portion, an antenna or the like. A part or all of them can be formed on a plastic by the present invention.

For example, when data is transmitted, text data input by an operation key (not shown in the figure) or a touch panel operation are transmitted into a main control section through an operation input control part. In the main control section, spectrum diffusion process is performed on the text data in the modulator-demodulator circuit portion, and after a digital-to-analog conversion processing and a frequency conversion processing are performed in the transmitter-receiver circuit portion, and the text data is transmitted to a base station through the antenna. In addition, when data is received, a spectrum reverse diffusion processing is performed on a signal received through the antenna from the base station in the modulator-demodulator circuit portion, and after the original text data is recovered, it is displayed as data in the display portion through the display portion driver circuit.

Note that the device shown in FIG. 13 (D) may function as an ultrasmall computer. Although not illustrated, a battery (a sheet-like battery or a solar battery) is also provided in the main body of the plastic 1020, too. A sheet like battery, a solar battery or the like can be manufactured by separating and transferring. Moreover, a bluetooth communications part may be provided in the main body of the plastic 1020.

What is claimed is:

1. A semiconductor device comprising:
    a circuit board;
    a transistor comprising source and drain electrodes;
    a first layer comprising the transistor over the circuit board;
    a capacitor comprising a first electrode, a dielectric thin film and a second electrode, wherein the dielectric thin film is interposed between the first electrode and the second electrode,
    a second layer comprising the capacitor over the first layer;
    a third electrode over the second layer; and
    a fourth electrode over the circuit board, the fourth electrode being electrically connected to the third electrode,
    wherein the third electrode is electrically connected to one of the source and the drain electrodes, and
    wherein the fourth electrode is not covered with the first layer.

2. The semiconductor device according to claim 1, wherein the circuit board is a ceramic board or a resin substrate.

3. The semiconductor device according to claim 1, wherein at least one selected from the group consisting of a CPU, a memory element, a thin film diode, a photoelectric transducer and a resistor element is provided on the circuit board.

4. The semiconductor device according to claim 1, wherein the semiconductor device is one selected from the group consisting of a video camera, a digital camera, a goggle type display, a car navigation, a DVD player, an electronic game machine, a card or a personal digital assistant.

5. A semiconductor device comprising:
    a circuit board;
    a transistor comprising source and drain electrodes;
    a first layer comprising the transistor over the circuit board;
    a capacitor comprising a first electrode, a dielectric thin film and a second electrode, wherein the dielectric thin film is interposed between the first electrode and the second electrode,
    a second layer comprising the capacitor over the first layer;
    a third layer comprising a wiring over the second layer;
    a third electrode over the second layer; and
    a fourth electrode over the circuit board, the fourth electrode being electrically connected to the third electrode,
    wherein the third electrode is electrically connected to one of the source and the drain electrodes,
    wherein the wiring is electrically connected to the third electrode, and
    wherein the fourth electrode is not covered with the first layer.

6. The semiconductor device according to claim 5, wherein the circuit board is a ceramic board or a resin substrate.

7. The semiconductor device according to claim 5, wherein at least one selected from the group consisting of a CPU, a memory element, a thin film diode, a photoelectric transducer and a resistor element is provided on the circuit board.

8. The semiconductor device according to claim 5, wherein the semiconductor device is one selected from the group consisting of a video camera, a digital camera, a goggle type display, a car navigation, a DVD player, an electronic game machine, a card or a personal digital assistant.

9. A semiconductor device comprising:
a circuit board;
a transistor comprising source and drain electrodes;
a first layer comprising the transistor over the circuit board;
a capacitor comprising a first electrode, a dielectric thin film and a second electrode, wherein the dielectric thin film is interposed between the first electrode and the second electrode,
a second layer comprising the capacitor over the first layer;
a third layer comprising a wiring over the second layer;
a third electrode over the second layer; and
a fourth electrode over the circuit board, the fourth electrode being electrically connected to the third electrode,
wherein the third electrode is electrically connected to one of the source and the drain electrodes,
wherein the wiring is electrically connected to one of the first and the second electrode, and
wherein the fourth electrode is not covered with the first layer.

10. The semiconductor device according to claim 9, wherein the circuit board is a ceramic board or a resin substrate.

11. The semiconductor device according to claim 9, wherein at least one selected from the group consisting of a CPU, a memory element, a thin film diode, a photoelectric transducer and a resistor element is provided on the circuit board.

12. The semiconductor device according to claim 9, wherein the semiconductor device is one selected from the group consisting of a video camera, a digital camera, a goggle type display, a car navigation, a DVD player, an electronic game machine, a card or a personal digital assistant.

* * * * *